US008052954B2

(12) United States Patent
Kurozumi et al.

(10) Patent No.: US 8,052,954 B2

(45) Date of Patent: Nov. 8, 2011

(54) BARIUM CALCIUM TITANATE, PRODUCTION PROCESS THEREOF AND CAPACITOR

(75) Inventors: Tadatoshi Kurozumi, Funabashi (JP); Akihiko Shirakawa, Chiba (JP)

(73) Assignee: Showa Denko K.K., Tokyo (JP)

(*) Notice: Subject to any disclaimer, the term of this patent is extended or adjusted under 35 U.S.C. 154(b) by 1002 days.

(21) Appl. No.: 11/660,606

(22) PCT Filed: Aug. 26, 2005

(86) PCT No.: PCT/JP2005/016055

§ 371 (c)(1), (2), (4) Date: Feb. 20, 2007

(87) PCT Pub. No.: WO2006/022447

PCT Pub. Date: Mar. 2, 2006

(65) Prior Publication Data

US 2007/0253145 A1 Nov. 1, 2007

Related U.S. Application Data

(60) Provisional application No. 60/606,888, filed on Sep. 3, 2004.

(30) Foreign Application Priority Data

Aug. 27, 2004 (JP) ................................ 2004-248205

(51) Int. Cl.
*C01G 23/00* (2006.01)

(52) U.S. Cl. ....................................... 423/598; 501/136

(58) Field of Classification Search .................. 423/598; 501/136–139
See application file for complete search history.

(56) References Cited

U.S. PATENT DOCUMENTS

| | | | | |
|---|---|---|---|---|
| 6,893,623 | B2 * | 5/2005 | Ohmori et al. | 423/598 |
| 7,431,911 | B2 * | 10/2008 | Shirakawa et al. | 423/598 |
| 2002/0074154 | A1 | 6/2002 | Kim et al. | |
| 2003/0044347 | A1 * | 3/2003 | Shirakawa et al. | 423/598 |

FOREIGN PATENT DOCUMENTS

| | | | |
|---|---|---|---|
| JP | 3-39014 | B2 | 6/1991 |
| JP | 2002-60219 | A | 2/2002 |
| JP | 2002-211920 | * | 7/2002 |
| JP | 2003-48774 | A | 2/2003 |
| WO | WO 00/35811 | A1 | 6/2000 |
| WO | WO 03/004416 | A1 | 1/2003 |
| WO | 2004/092070 | A1 | 10/2004 |

OTHER PUBLICATIONS

M. Ceh, et al, "Solubility of Calcium Oxide in Barium Titanate", Materials Research Bulletin, vol. 29, No. 3, 1994, pp. 269-275, XP002354304.

* cited by examiner

*Primary Examiner* — Steven Bos

(74) *Attorney, Agent, or Firm* — Sughrue Mion, PLLC

(57) ABSTRACT

A barium calcium titanate of the present invention has a remarkable effect that a fine barium calcium titanate powder having excellent dispersibility, reduced impurities and high crystallinity and being solid-dissolved at an arbitrary ratio, and a production process thereof are provided.

The barium calcium titanate represented by the compositional formula: $(Ba_{(1-X)}Ca_X)_YTiO_3$ (wherein $0<X<0.2$ and $0.98 \leqq Y \leqq 1.02$), which contains 3 mol % or less (including 0 mol %) of an orthorhombic perovskite compound and in which the specific surface area D is from 1 to 100 $m^2/g$.

7 Claims, 13 Drawing Sheets

BARIUM CALCIUM TITANATE, PRODUCTION PROCESS THEREOF AND CAPACITOR

Priority is claimed from Japanese Patent Application No. 2004-248205, filed Aug. 27, 2004 the content of which is incorporated herein by reference, and benefit is claimed from U.S. provisional application No. 60/606,888 filed Sep. 3, 2004, the content of which is incorporated herein by reference.

TECHNICAL FIELD

The present invention relates to a particulate barium calcium titanate used for electronic materials such as dielectric material, piezoelectric material, pyroelectric material, multilayer ceramic capacitor and thin-film material, and a production process thereof.

More specifically, the present invention relates to a particulate barium calcium titanate represented by the formula: $(Ba_{(1-X)}Ca_X)_YTiO_3$ ($0<X<0.2$, $0.98 \leqq Y \leqq 1.02$), which contains 3 mol % or less of an orthorhombic perovskite compound and in which assuming that the specific surface area D is from 1 to 100 $m^2/g$ and the ratio of the c-axis length to the a-axis length determined from the a-axis length (unit: nm) and the c-axis length (unit: nm) of a crystal lattice as calculated by the Rietveld method is y, D and y satisfy a specific relationship.

BACKGROUND ART

The barium titanate takes a perovskite-type structure where barium and Ti occupy the A site and the B site, respectively, and titanium is slightly deviated from the center. By virtue of this structure, the barium titanate expresses ferroelectricity and in turn excellent electric properties such as dielectricity, piezoelectiricity and pyroelectricity and therefore, is being widely used as various electronic materials.

Also, the barium calcium titanate is widely used as a barium titanate-based electronic material resulting from replacing a part of barium by calcium and in particular, the barium calcium titanate is attracting attention as a ceramic capacitor material in which the temperature dependency and reliability of dielectric property of the barium titanate are improved.

Examples of the usage thereof include, by making use of high dielectricity of this material, various capacitor materials (including multilayer ceramic capacitor), dielectric filter, dielectric antenna, dielectric resonator, dielectric duplexer, capacitor and phase shifter, and also include stacked piezoelectric actuator utilizing piezoelectricity. As for the method of using the barium titanate in an electronic material, there is a method of mixing a barium titanate powder with a solvent to form a slurry or a paste, and shaping it into a thin film or a porcelain by molding, sintering, sheeting or the like.

In recent years, it is demanded to develop a barium calcium titanate having a small particle diameter, a narrow particle size distribution, excellent dispersibility, high crystallinity and high purity and being capable of coping with down-sized, lightweight and high-performance electronic parts.

For example, in order to obtain a downsized, lightweight and high-capacitance multilayer ceramic capacitor, the particle diameter of the barium calcium titanate must be made small, thereby decreasing the distance between layers stacked and increasing the number of layers stacked. In general, when the particle diameter of the barium calcium titanate becomes small, the c/a ratio decreases and the crystal comes close to a cubic crystal, but if the c/a ratio decreases, this leads to decrease in the ferroelectricity and on use as a dielectric material, decrease in the electrostatic capacitance. To solve this problem, a barium calcium titanate exhibiting a high c/a ratio despite a small particle is demanded. In order to exhibit a high c/a ratio, the barium calcium titanate must be highly crystalline.

Also, if the barium calcium titanate powder undergoes aggregation at the time of mixing the powder with a solvent to form a slurry or a paste, the sintering density decreases and in turn the electric properties such as breakdown voltage and migration deteriorate. Furthermore, impurities contained in the barium calcium titanate have adverse effect on the electric properties.

Accordingly, in order to cope with downsized, lightweight and high-performance electronic parts, development of a barium calcium titanate having a small particle diameter, a narrow particle size distribution, excellent dispersibility and high purity is necessary.

Conventionally, the barium titanate has been produced by the following process.

As for the production process of a high-purity high-crystalline particulate barium titanate, a flux process is known. However, in this process, not only the production cost is very high but also the particle formation can be effected only by grinding and therefore, the particles have a broad particle size distribution and poor dispersibility. Accordingly, this process is unsuitable for the electronic materials using a particle material.

As for the process of producing a barium titanate for electronic materials, there is generally known, for example, a solid-phase process of mixing powders of an oxide and a carbonate used as raw materials in a ball mill or the like and reacting the mixture at a high temperature of about 800° C. or more to produce a barium titanate; an oxalate process of preparing an oxalic acid composite salt and thermally decomposing the composite salt to obtain a titanium-containing composite oxide particle; a hydrothermal synthesis process of reacting raw materials in an aqueous solvent at high temperature and high pressure to obtain a precursor; and an alkoxide process of using a metal alkoxide as a raw material and hydrolyzing it to obtain a precursor.

Also, with respect to the production process of a barium titanate, for example, a process of reacting a hydrolysate of a titanium compound with a water-soluble barium salt in a strong alkali (Patent Document 1), and a process of reacting a titanium oxide sol with a barium compound in a strong alkali aqueous solution (Patent Document 2) are generally known, and studies are being aggressively made to improve these synthesis methods.

The solid-phase process has a problem that despite low production cost, the produced particulate barium titanate has a large particle diameter. If this particle is ground, the particle diameter may be decreased but the particle size distribution is broadened and the shaping density may not be enhanced. Furthermore, distortion may be generated in the crystal structure due to the effect of grinding and a barium titanate powder suitable for down-sized high-performance electronic parts may not be obtained.

In the oxalate process, a smaller particle than that produced by the solid-phase process is obtained, but a carbonate group derived from the oxalic acid remains as an impurity. Furthermore, a large amount of a hydroxyl group attributable to water taken into the inside remains and this deteriorates the electric properties. In this way, the oxalate process is disadvantageous in that a barium titanate powder with excellent electric properties cannot be obtained.

The hydrothermal synthesis process has a problem that although a fine particulate barium titanate is obtained, a hydroxyl group attributable to water taken into the inside remains to cause many defects and a particulate barium titanate with excellent electric properties can be hardly obtained. Also, this process is performed under high-temperature high-pressure conditions and therefore, exclusive equipment is necessary and the cost rises.

In the alkoxide process, a barium titanate finer than that produced by the hydrothermal synthesis process is obtained, but a hydroxyl group attributable to water taken into the inside remains to cause many defects and a titanium-containing composite oxide with excellent electric properties can be hardly obtained.

Patent Document 1: JP-B-3-39014 (the term "JP-B" as used herein means an "examined Japanese patent publication")

Patent Document 2: International Patent Publication WO00/35811, pamphlet

Patent Document 3: International Patent Publication WO03/004416, pamphlet

Patent Document 4: JP-A-2002-60219 (the term "JP-A" as used herein ++-means an "unexamined published Japanese patent application")

Patent Document 5: JP-A-2003-48774

DISCLOSURE OF INVENTION

In the methods described in Patent Documents 1 and 2, potassium hydroxide or sodium hydroxide is used as the alkali and for obtaining a high-purity particulate barium titanate, a step of removing such an alkali component must be provided after the reaction, but in practice, dissolution of barium and entering of hydroxyl group take place simultaneously in the removal step and therefore, a barium titanate having high crystallinity can be hardly obtained in some cases.

On the other hand, for producing a barium calcium titanate, a method of adding calcium to the raw materials in the above-described processes may be considered. However, the atomic radius greatly differs between barium and calcium and therefore, a barium titanate having uniformly solid-dissolved therein barium and calcium is difficult to produce. In this way, a raw material compound remains or an orthorhombic perovskite compound such as calcium titanate is mixed as a by-product and it is difficult to produce a barium calcium titanate capable of coping with down-sized, lightweight and high-performance electronic parts. Furthermore, in order to uniformly solid-dissolve barium and calcium, a heat treatment at a high temperature is necessary but this allows the particle to readily grow and disadvantageously makes it difficult to produce a fine particulate barium calcium titanate.

Patent Documents 3, 4 and 5 each discloses a production process of a barium calcium titanate.

In the processes described in Patent Documents 3 and 4, a fine barium calcium titanate can be obtained, but since a barium compound and a calcium compound are simultaneously charged, an orthorhombic perovskite compound is mingled as a by-product of a competitive reaction.

Furthermore, the process described in Patent Document 4 uses a very complicated step and requires an expensive titanium alkoxide.

In the process described in Patent Document 5, calcium carbonate, titanium oxide and barium titanate are heat-treated at 1,000° C. or more and therefore, a fine barium calcium titanate of 0.2 μm or less cannot be obtained.

An object of the present invention is to provide a barium calcium titanate having a small particle diameter, a narrow particle size distribution, excellent dispersibility, high crystallinity and excellent electric properties; and a production process thereof.

In order to attain this object, the present invention provides the following means.

[1] A barium calcium titanate represented by the compositional formula: $(Ba_{(1-X)}Ca_X)_YTiO_3$ (wherein $0<X<0.2$ and $0.98 \leqq Y \leqq 1.02$), which contains 3 mol % or less (including 0 mol %) of an orthorhombic perovskite compound and in which the specific surface area D is from 1 to 100 $m^2/g$.

[2] The barium calcium titanate as claimed in [1], wherein assuming that the ratio (c/a) between the a-axis length and the c-axis length of a crystal lattice as calculated by the Rietveld method is y, the relationship between the y and the specific surface area D satisfies the following formula (1) or (2):

$$y \geqq 0.0095-8.8\times10^{-6}\times D^3 \text{ (provided that when } 1 \leqq D \leqq 9.7) \quad (1)$$

$$y \geqq 1.003 \text{ (provided that when } 9.7<D \leqq 100) \quad (2)$$

[3] The barium calcium titanate as claimed in [1] or [2], wherein the barium calcium titanate contains 80% or more of a single crystal particle.

[4] The barium calcium titanate as claimed in any one of [1] to [3], which contains 80% or more of a particle not allowing for the presence of a vacancy of 1 μm or more within the particle.

[5] The barium calcium titanate as claimed in any one of [1] to [4], wherein assuming that the average particle diameter on the volume basis as determined by the image analysis method is D1 and the particle diameter when the volume accumulated from the smaller particle diameter side reaches 5% is D2, D2/D1 is from 0.5 to 1.

[6] The barium calcium titanate as claimed in any one of [1] to [5], wherein assuming that the average particle diameter on the volume basis as determined by the image analysis method is D1, the particle diameter when the volume accumulated from the smaller particle diameter side reaches 95% is D3 and the maximum particle diameter is D4, D3/D1 is from 1 to 1.8 and D4/D1 is from 1 to 2.

[7] The barium calcium titanate as claimed in any one of [1] to [6], which is a powder having a specific surface area D of 5 to 100 $m^2/g$.

[8] The barium calcium titanate as claimed in any one of [1] to [7], wherein X in the compositional formula is $0.05 \leqq X<0.2$.

[9] A process for producing a barium calcium titanate, comprising a step of synthesizing a barium titanate by charging a barium hydroxide and a titanium oxide into a basic compound-containing basic solution at a pH of 10 or more and allowing the reaction to proceed, a step of synthesizing a barium calcium titanate by charging a calcium hydroxide and allowing the reaction to proceed, and a step of vaporizing and removing the basic compound.

[10] The process for producing a barium calcium titanate as claimed in [9], wherein the molar ratio of the barium hydroxide and the calcium hydroxide is set to from 1:0 to 0.8:0.2, the amount of the titanium oxide is set to from 0.98 to 1.02 times the total molar amount of the barium hydroxide and the calcium hydroxide, and these barium hydroxide, calcium hydroxide and titanium oxide are reacted in a basic solution to produce a barium calcium titanate.

[11] The process for producing a barium calcium titanate as claimed in [9] or [10], wherein the reaction in the step of synthesizing a barium titanate is continued until the amount of barium ion remaining in the basic solution becomes 1/100 or less of the amount charged, and the reaction in the step of synthesizing a barium calcium titanate is continued until the residual amount of calcium ion becomes 1/100 or less of the amount charged.

[12] The process for producing a barium calcium titanate as claimed in any one of [9] to [11], wherein after the step of removing the basic compound, the barium calcium titanate is heat-treated at 350 to 1,200° C.

[13] The process for producing a barium calcium titanate as claimed in any one of [9] to [1,2], wherein in the process from the synthesis of a barium titanate to the synthesis of a barium calcium titanate, the concentration of a carbonate group in the reaction solution is controlled to be from 0 to 500 ppm in terms of $CO_2$.

[14] The process for producing a barium calcium titanate as claimed in any one of [9] to [13], wherein the titanium oxide contains a brookite crystal.

[15] The process for producing a barium calcium titanate as claimed in any one of [9] to [14], wherein the titanium oxide is a titanium oxide sol obtained by hydrolyzing a titanium compound in an acidic solution.

[16] The process for producing a barium calcium titanate as claimed in any one of [9] to [15], wherein the basic compound is a substance which undergoes vaporization by any one or more means of evaporation, sublimation and thermal decomposition under atmospheric pressure or reduced pressure.

[17] The process for producing a barium calcium titanate as claimed in any one of [9] to [16], wherein the basic compound is an organic base compound.

[18] The process for producing a barium calcium titanate as claimed in any one of [9] to [17], wherein the basic compound is tetramethylammonium hydroxide.

[19] A dielectric material comprising the barium calcium titanate claimed in any one of [1] to [8].

[20] A paste comprising the barium calcium titanate claimed in any one of [1] to [8].

[21] A slurry comprising the barium calcium titanate claimed in any one of [1] to [8].

[22] A thin-film shaped product comprising the barium calcium titanate claimed in any one of [1] to [8].

[23] A dielectric porcelain produced by using the barium calcium titanate claimed in any one of [1] to [8].

[24] A pyroelectric porcelain produced by using the barium calcium titanate claimed in any one of [1] to [8].

[25] A piezoelectric porcelain produced by using the barium calcium titanate claimed in any one of [1] to [8].

[26] A capacitor comprising the dielectric porcelain claimed in [23].

[27] An electronic device comprising at least one member selected from the group consisting of the thin-film shaped product, the porcelain and the capacitor claimed in any one of [22] to [26].

[28] A sensor comprising one species or two or more species of the thin-film shaped product or porcelain claimed in any one of [22] to [25].

[29] A dielectric film comprising the barium calcium titanate claimed in any one of [1] to [8].

[30] A capacitor produced by using the dielectric film claimed in [29].

The barium calcium titanate as a preferred embodiment of the present invention has a remarkable effect that a fine barium calcium titanate powder having excellent dispersibility, reduced impurities and high crystallinity and being solid-dissolved at an arbitrary ratio, and a production process thereof are provided.

This barium calcium titanate powder and a slurry or paste containing the powder can exert excellent electric properties, and a dielectric material, a piezoelectric material, a pyroelectric material or the like having excellent performance, such as porcelain, thin film and dielectric film, can be obtained therefore. Furthermore, by using such a material for an electronic device, a down-sized lightweight electronic device can be realized. The dielectric film has excellent electric property and therefore, even when formed into a thin film, the dielectric film can exert excellent properties and can be applied to an in-substrate capacitor or the like. Use of this capacitor in electronic devices such as cellular phone or digital camera is very effective for the realization of a down-sized, lightweight and high-performance device.

Figure 1:
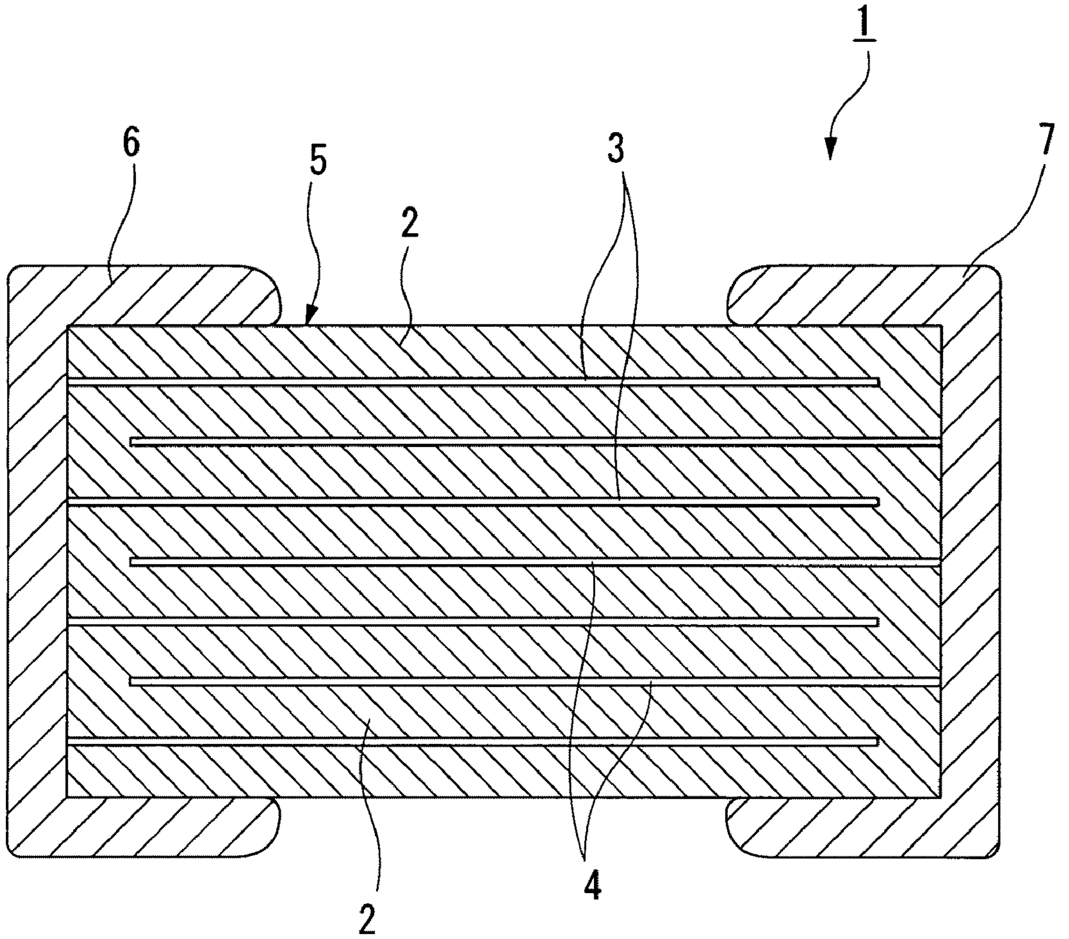
FIG. 1 is one example of a cross-sectional schematic view of a multilayer ceramic capacitor as a preferred embodiment of the present invention.

The reference numerals shown in Fig.s are defined as follows: 1, Multilayer ceramic capacitor (capacitor); 2, Dielectric layer.

BEST MODE FOR CARRYING OUT THE INVENTION

The present invention is described in detail below.

The barium calcium titanate in a preferred embodiment of the present invention is a solid-solution perovskite-type compound represented by the formula $(Ba_{(1-Y)}Ca_X)_YTiO_3$ ($0<X<0.2$, $0.98\leqq Y\leqq 1.02$). The "solid-solution" as used herein means a state that atoms are not merely "mixed" but are solid-dissolved at a constant ratio. The crystal structure of the barium calcium titanate in a preferred embodiment of the present invention can be confirmed by the X-ray diffraction measurement, and the ratio between barium and calcium in the barium calcium titanate can be determined from the peak positions in the X-ray diffraction diagram.

The ratio (solid-solution ratio) X of barium and calcium in the powder is preferably from 0 to 0.2, more preferably from 0 to 0.1. For example, the solid-solution ratio X is preferably adjusted so that desired electric properties can be attained. For example, the dielectric constant at room temperature is about 1,600 in the case of barium titanate (X=0), and about 900 in the case of calcium barium titanate (X=0.15). In the barium calcium titanate of the present invention, X and Y values can be controlled with precision of 1/100 or less, preferably 1/1,000. By adjusting the solid-solution ratio of barium and calcium in this way, a barium calcium titanate of which dielectric constant at room temperature is adjusted to a desired value can be obtained.

The ratio (Y) of the total molar number of barium and calcium to the molar number of titanium is preferably from 0.98 to 1.02, more preferably from 0.99 to 1.01, still more preferably from 0.995 to 1.005, and this ratio is adjusted so that desired electric properties can be attained. The ratio Y is preferably closer to 1, because the defects are less generated and the crystallinity becomes higher.

In order to improve the electric properties of the barium calcium titanate in a preferred embodiment of the present invention, another compound may be added and used and this causes no trouble.

In general, for the purpose of downsizing of an electronic device, if a specific surface area is less than 1 $m^2/g$ the powder is not effective, because the particle diameter is excessively large, whereas if the specific surface area exceeds 100 $m^2/g$, the powder readily undergoes aggregation and its handling becomes difficult. The barium calcium titanate in a preferred embodiment of the present invention has a specific surface area of 1 to 100 $m^2/g$, preferably from 5 to 70 $m^2/g$, more preferably from 5 to 50 $m^2/g$. Incidentally, a specific surface area determined by the BET method is preferably employed in the present invention.

The relationship between the length of c-axis length and a-axis length to (for) the Ca-replacing amount is described, for example, in *J. Amer. Ceram. Soc.*, 38, 142 (1955). As the Ca-replacing amount is larger, the c-axis length and a-axis length are smaller. Assuming that the specific surface area as determined by the BET method is D (unit $m^2/g$) and the ratio (c/a) of the c-axis length to the a-axis length as determined by the Rietveld method is y, the barium calcium titanate in a preferred embodiment of the present invention satisfies the following formula (1) or (2) and is characterized in that the particle is a fine particle and has a high c/a ratio.

$$y \geqq 1.0095-8.8\times10^{-6}\times D^3 \text{ (provided that when } 1\leqq D\leqq 9.7) \quad (1)$$

$$y \geqq 1.003 \text{ (provided that when } 9.7<D\leqq 100) \quad (2)$$

In the barium calcium titanate in a preferred embodiment of the present invention, an orthorhombic perovskite compound as a by-product may be contained in a range of 3 mol % or less. If the abundance of the orthorhombic perovskite compound exceeds 3 mol %, this is detected as a peak in the X-ray diffraction. When the abundance is 3 mol % or less, this can be determined as a difference between the solid-solution ratio of barium calcium titanate and the average Ca-mixing amount of the entire powder. The solid-solution ratio of barium calcium titanate can be determined by measuring the peak positions of X-ray diffraction or the phase transition points of orthorhombic and tetragonal systems out of three sequential phase transition points. The average Ca-mixing amount of the entire powder can be determined by preparing a sample from the entire powder through a glass bead method and measuring the prepared sample according to a fluorescent X-ray method. Also, the orthorhombic perovskite compound differs in the shape and can be detected by the observation through a scanning electron microscope.

In the barium calcium titanate in a preferred embodiment of the present invention, calcium hydroxide, barium hydroxide and titanium oxide as raw materials may be further contained in an amount of about less than 1/1,000 mol.

The barium calcium titanate in a preferred embodiment of the present invention is characterized in that a single crystal occupies 80% or more, preferably 90% or more, more preferably 100%. Whether the crystal is a single crystal can be confirmed by the TEM (transmission electron microscope) observation (preferably observed by forming the barium calcium titanate particle into a thin film).

Also, in the barium calcium titanate according to a preferred embodiment of the present invention, the particle in which a vacancy of 1 nm or more is not present occupies 80% or more, preferably 90% or more, more preferably 100%, of all particles. It is preferred that a hydroxyl group or a defect ascribable to the elimination of hydroxyl group is not present within the particle and if any, the size thereof is less than 1 nm.

The hydroxyl group present in the barium calcium titanate is detected as a peak in the vicinity of 3,500 $cm^{-1}$ by the infrared spectroscopy, but other than the hydroxyl group within the particle, the hydroxyl group present on the surface is also detected. However, the hydroxyl group present on the surface is eliminated at a temperature lower than 700° C. and therefore, the hydroxyl group within the particle can be detected by performing the infrared spectroscopy after previously preheating the particle at 700° C.

In the barium calcium titanate according to a preferred embodiment of the present invention, a powder in which a vacancy of 1 nm or more is not present within the particle occupies 80% or more of the entire powder and a hydroxyl group or a defect ascribable to the elimination of hydroxyl group is scarcely present within the particle, so that a high dielectric constant can be exhibited.

In the barium calcium titanate according to a preferred embodiment of the present invention, assuming that the average particle diameter on the volume basis as determined by the image analysis method is D1, the particle diameter when the volume accumulated from the smaller particle diameter side reaches 5% is D2, the particle diameter when the accumulated volume reaches 95% is D3 and the maximum particle diameter is D4, D2/D1 is preferably from 0.5 to 1, D/3/D1 is preferably from 1 to 1.8, and D4/D1 is preferably from 1 to 2. The barium calcium titanate in a preferred embodiment of the present invention less contains an orthorhombic perovskite compound having a large particle diameter and therefore, the particle size distribution thereof is narrow.

As the D2/D1 value and the D3/D1 value each comes closer to 1, the primary particle size distribution becomes narrower and this is more preferred.

In a preferred embodiment of the present invention, D2/D1 is from 0.5 to 1, preferably from 0.6 to 1.

Also, in a preferred embodiment of the present invention, D3/D1 is from 1 to 1.8, preferably from 1 to 1.7.

Furthermore, in a preferred embodiment of the present invention, D4/D1 is from 1 to 2, preferably from 1 to 1.9.

This barium calcium titanate has a small particle diameter and excellent electric properties with high dielectric constant and when a dielectric material such as dielectric porcelain obtained from the barium calcium titanate is used, downsized electronic parts such as multilayer ceramic capacitor can be obtained. In addition, by using such an electronic part, reduction in the size and weight of electronic devices can be realized.

The process for producing a barium calcium titanate of the present invention is described below.

In the process for producing a barium calcium titanate of the present invention, it is preferred that the molar ratio of the barium hydroxide and the calcium hydroxide is set to an arbitrary range from 1:0 to 0.8:0.2, the amount of the titanium oxide is set to from 0.98 to 1.02 times the total molar number of the barium hydroxide and the calcium hydroxide, and these are reacted in a basic solution at a pH of 10 or more in which a basic compound is present. At this time, a barium hydroxide and a titanium oxide are first reacted in the basic solution to synthesize a barium titanate, and subsequently a calcium hydroxide is charged and reacted to produce a barium calcium titanate.

In the present invention, it is preferred that a barium hydroxide and a titanium oxide are first reacted to product a barium titanium and thereafter, a calcium hydroxide is reacted with the barium titanate to obtain a barium calcium titanate. If a barium hydroxide, a calcium hydroxide and a titanium oxide all are charged at the same time and reacted, a competitive reaction tends to take place between the reaction of barium hydroxide with titanium oxide and a reaction of titanium oxide with barium titanate, resulting in production of an orthorhombic perovskite compound. Furthermore, the amount of calcium which can be solid-dissolved is only 5 mol % at a maximum. According to the preferred process of the present invention, a barium titanate having high crystallinity is first produced and thereafter reacted with calcium, so that a barium calcium titanate having an orthorhombic perovskite compound content of 3 mol % or less can be produced. The orthorhombic perovskite compound content is preferably 2 mol % or less, more preferably 1 mol % or less, still more preferably 0 mol %. Furthermore, according to the preferred embodiment of the present invention, a barium calcium titanate with high crystallinity, in which maximally about 20% of barium is replaced by calcium, can be produced.

More specifically, in a preferred embodiment of the present invention, a barium hydroxide, a calcium hydroxide and a titanium oxide sol with the hydroxides being at an arbitrary ratio are blended to a predetermined ratio to produce a barium calcium titanate with arbitrary ratios X and Y. For example, a $Ba_{0.99}Ca_{0.01}TiO_3$ powder can be produced by charging barium hydroxide:calcium hydroxide:titanium oxide=99 mol:1 mol: 100 mol, and a $Ba_{0.9}Ca_{0.1}TiO_3$ powder can be produced by charging barium hydroxide:calcium hydroxide: titanium oxide=90 mol:10 mol:100 mol.

More preferably, a $Ba_{0.990}Ca_{0.010}TiO_{3.000}$ powder can be produced by charging barium hydroxide:calcium hydroxide: titanium oxide=99.0 mol:1.0 mol:100.0 mol, and a $Ba_{0.900}Ca_{0.100}TiO_{3.000}$ powder can be produced by charging barium hydroxide:calcium hydroxide:titanium oxide=90.0 mol:10.0 mol:100.0 mol.

In the process for producing a barium calcium titanate according to a preferred embodiment of the present invention, a basic solution in which a basic compound is present is preferably used. The reason therefor is not clearly known but it is presumed that as the alkalinity is higher, the barium ion and calcium ion are more readily reacted with titanium oxide. The pH of the solution is 10 or more, preferably 13 or more, more preferably 14 or more. The upper limit of the amount charged of a basic compound is a saturated solubility of the basic compound in water.

In a preferred embodiment of the present invention, the reaction with titanium oxide in a basic solution at a pH of 10 or more in which a basic compound is present is continued until the residual amount of barium becomes 1/100 or less, preferably 1/1,000 or less, of the amount charged, whereby a barium titanate is synthesized. Also, after charging a calcium hydroxide, the reaction is continued until the residual amount of calcium ion becomes 1/100 or less, preferably 1/1,000 or less, of the amount charged, whereby a barium calcium titanate is produced. By controlling the reaction in this way, a barium calcium titanate where the content of calcium hydroxide, barium hydroxide and titanium oxide as raw materials is less than 1/100 mol, preferably less than 1/1,000, can be produced. In other words, a barium calcium titanate in which the X and Y values are controlled to a 1/100 order, preferably a 1/1,000 order, can be produced.

The amounts of barium ion and calcium after the reaction can be determined by removing the solid content from the reaction solution and quantitating the amount of each ion in the reaction solution according to an ICP spectrometry, an atomic absorption method or the like.

In the present invention, as described above, the reaction is continued until the total concentration of ions in the solution after reaction becomes 1/100 or less, preferably 1/1,000 or less, more preferably 1/2,000 or less, still more preferably 1/5,000 or less, yet still more preferably 1/10,000 or less, of the amount charged. By such a reaction, the reaction conversion to a barium calcium titanate is elevated, unreacted raw materials such as hydroxide and titanium oxide are decreased to give a higher purity, and the crystallinity is enhanced. The decrement of the total concentration after reaction can be determined by the following formula (3):

[Chem. 1]

$$([A1']+[A2'])\times L2/([A1]+[A2]) \quad (3)$$

[A1'], [A2']: each is a molar concentration (mol/ml) determined by reducing A1 ion weight concentration or A2 ion weight concentration in solution after reaction,

[A1], [A2]: each is a molar number (mol) of hydroxide charged into reaction, and

[L2]: an amount (ml) of reaction solution.

The above-described synthesis reaction is most industrially performed by stirring under heat. In particular, when mechanical stirring is applied, the raw materials are intermingled with each other and this is preferred. The reaction solution is basic and readily absorbs $CO_2$ in air and therefore, the reaction is preferably performed in a closed state or while blowing an inert gas so that the reaction solution can be prevented from contacting with air. If $CO_2$ is absorbed into the reaction solution, this is contained as a carbonate group in the reaction solution. This carbonate group (the carbonate species including $CO_2$, $H_2CO_3$, $HCO_3^-$ and $CO_3^{2-}$) reacts with a barium hydroxide or a calcium hydroxide to produce a stable barium carbonate or calcium carbonate. The barium carbonate or calcium carbonate does not react with a titanium oxide and tends to remain as an impurity in the barium calcium titanate. Accordingly, the concentration of the carbonate group (in terms of $CO_2$; unless otherwise indicated, hereinafter the same) in the reaction solution is preferably controlled. By controlling the carbonate group concentration, a high-purity barium calcium titanate can be stably produced.

The concentration in terms of $CO_2$ in the reaction solution is preferably from 0 to 500 ppm by mass, more preferably from 0 to 200 ppm by mass, still more preferably from 0 to 100 ppm by mass. In order to decrease the concentration of the carbonate group in the reaction solution, the water before dissolving a basic compound therein is preferably decarboxylated by a heat treatment immediately before the production.

In order to elevate the crystallinity of the barium calcium titanate, the reaction temperature is preferably as high as possible. The reaction temperature can be elevated by a hydrothermal reaction from 100° C. to the critical temperature of the solution but for performing this reaction, equipment taking care of safety, such as autoclave, is necessary. Therefore, it is preferred that the temperature is elevated by boiling to 95° C. or more and the reaction is performed while keeping this temperature.

The reaction time of a barium hydroxide with a titanium oxide is usually 2 hours or more, preferably 3 hours or more, more preferably 4 hours or more. Also, the reaction time after charging a calcium hydroxide is usually 2 hours or more, preferably 4 hours or more, more preferably 6 hours or more.

Examples of the impurity adversely affecting the electric properties of the barium calcium titanate include trace components such as metal ion and anion. These impurities may be removed by various methods, for example, a method of treating the slurry after the completion of reaction by electrodialysis, ion exchange, water washing, acid cleaning or permeable membrane. However, in these methods, it must be noted that barium and the like contained in the barium calcium titanate are sometimes ionized simultaneously with impurity ion and partially dissolved in the slurry, as a result, not only barium and calcium can be hardly solid-dissolved at a desired ratio but also defects may be generated in the crystal to lower the crystallinity. Furthermore, since the reaction solution is basic, carbon dioxide in air is readily intermixed during the treatment and the carbonate content in the barium calcium titanate sometimes increases.

From these reasons, it is preferred to select raw materials reduced in impurities and at the same time, prevent mixing of impurities during the synthesis reaction and firing. In addition, after the completion of synthesis reaction, impurities are preferably removed in the form of a gas through evaporation, sublimation and/or thermal decomposition at a temperature from room temperature to firing possible temperature under atmospheric pressure or reduced pressure. At this time, the basic compound contained in the alkali solution is preferably decomposed at the same time and removed in the form of a gas.

The firing is generally performed for enhancing the crystallinity of titanium-containing composite oxides but on the other hand, impurities can be evaporated, sublimated and/or thermally decomposed by firing and removed in the form of a gas. Examples of the impurity removable by this method include organic amines having a small carbon number, organic bases such as hydroxide of ammonia salt, and trace organic materials and carbonates contained as impurities in raw materials. The firing is usually performed at a firing possible temperature in the range from 350 to 1,200° C. The firing atmosphere is not particularly limited and the firing is usually performed in air or under reduced pressure.

Incidentally, after the completion of synthesis reaction, the slurry is preferably subjected to solid-liquid separation and then fired, because the heat energy necessary for the firing is decreased or the crystallinity is elevated. The solid-liquid separation contains the steps of precipitation, concentration, filtration, and/or drying, and grinding of the powder. By the precipitation, concentration and filtration, impurities dissolved in the solution can be removed. A coagulant or dispersant may be used so as to change the precipitation rate or filtration rate. The coagulant or dispersant is preferably removable as a gas through evaporation, sublimation and/or thermal decomposition.

The drying step is a step of evaporating the water content, but depending on the kind of the basic compound or impurity, a part or the entire amount of impurities can be removed through evaporation, sublimation and/or thermal decomposition. For the drying, a method such as drying under reduced pressure, hot-air drying or freeze-drying is used. The drying is usually performed at room temperature to 350° C. for 1 to 24 hours. The drying atmosphere is not particularly limited, but the drying is usually performed in air or inert gas or under reduced pressure. Thereafter, the powder may be ground by an appropriate method.

A hydroxide such as the barium hydroxide or calcium hydroxide for use in the present invention is not particularly limited and may be an anhydrous salt or a hydrate as long as it is a hydroxide. The barium calcium titanate of the present invention can also be produced even by using a salt of barium and a salt of calcium.

Furthermore, the titanium oxide sol for use in the present invention is not particularly limited but is preferably a titanium oxide sol containing a brookite crystal, or a titanium oxide sol obtained by hydrolyzing a titanium salt in an acidic solution.

As long as a brookite crystal is contained, the titanium oxide sol may contain a brookite titanium oxide alone or may contain a rutile-type titanium oxide and an anatase-type titanium oxide. In the case of containing a rutile-type titanium oxide and an anatase-type titanium oxide, the ratio of the brookite titanium oxide in the titanium oxide is not particularly limited but is generally from 1 to 100 mass %, preferably from 10 to 100 mass %, more preferably from 50 to 100 mass %. In order to obtain a titanium oxide powder having excellent dispersibility in a solvent, crystalline structure is more preferred than amorphous structure, because simple particles is readily formed. Particularly, the brookite titanium oxide exhibits excellent dispersibility. The reason therefor is not clearly known but this is considered to have relationship with the fact the zeta potential of brookite crystal at a pH of 2 is higher than that of rutile-type or anatase-type crystal.

Examples of the process for producing a titanium oxide powder containing a brookite crystal include a production process in which an anatase-type titanium oxide powder is heat-treated to obtain a titanium oxide powder containing a brookite crystal; and a liquid-phase production process in which a solution of a titanium compound such as titanium tetrachloride, titanium trichloride, titanium alkoxide or titanium sulfate is neutralized or hydrolyzed to obtain a titanium oxide sol having dispersed therein titanium oxide powder.

In the case of using a brookite crystal-containing titanium oxide powder as the production raw material, a titanium oxide sol obtained by hydrolyzing a titanium salt in an acidic solution is preferably used as the titanium oxide powder. The powder of this titanium oxide sol has a small particle diameter and excellent dispersibility. The process for producing the titanium oxide sol is preferably, for example, a process in which titanium tetrachloride is added to hot water at 75 to 100° C., and the titanium tetrachloride is hydrolyzed while controlling the chloride ion concentration at a temperature from 75° C. to the boiling point of the solution, thereby obtaining a brookite crystal-containing titanium oxide powder in the form of a sol (see, JP-A-11-43327), or a process where titanium tetrachloride is added to hot water at 75 to 100° C., and the titanium tetrachloride is hydrolyzed in the existence of one party or both parties of nitrate ion and phosphate ion, while controlling the total concentration of chloride ion, nitrate ion and phosphate ion at a temperature from 75° C. to the boiling point of the solution, thereby obtaining a brookite crystal-containing titanium oxide powder in the form of a sol (see, International Patent Publication WO99/58451, pamphlet).

As for the size of the thus-obtained brookite crystal-containing titanium oxide powder, the primary powder diameter is usually from 1 to 100 nm, preferably from 3 to 50 μm, more preferably from 5 to 20 nm. If the primary powder diameter exceeds 100 nm, the titanium-containing composite oxide produced by using this powder as the raw material comes to have a large particle diameter and is sometimes unsuited for functional materials such as dielectric material and piezoelectric material, whereas if the primary powder diameter is less than 1 nm, the handling in the process of producing the titanium oxide powder may be difficult.

In the case of using a titanium oxide sol obtained by hydrolyzing a titanium salt in an acidic solution, the titanium oxide is not limited in its crystal form and not limited to a brookite crystal phase.

When a titanium salt such as titanium tetrachloride or titanium sulfate is hydrolyzed in an acidic solution, the reaction rate is reduced as compared with the case of performing the hydrolysis in a neutral or basic solution and therefore, a titanium oxide sol with simple particle diameter and excellent dispersibility is obtained. Furthermore, anion such as chloride ion and sulfate ion can be hardly taken into the inside of the produced titanium oxide powder and therefore, when a titanium-containing composite oxide powder is produced, the intermingling of anion into the powder can be decreased.

On the other hand, if the hydrolysis is performed in a neutral or basic solution, the reaction rate increases and many nucleations occur in the initial stage, as a result, a titanium oxide sol having bad dispersibility despite a small particle diameter is produced, causing vine-like aggregation of powder. If a titanium-containing composite oxide powder is produced by using such a titanium oxide sol as the raw material, the obtained powder may suffer from bad dispersibility despite a small particle diameter. In addition, anion readily intermingles into the inside of the titanium oxide powder and the removal of such anion in the subsequent step is sometimes difficult.

The process for hydrolyzing a titanium salt in an acidic solution to obtain a titanium oxide sol is not particularly limited as long as the solution can be kept acidic, but a process of using titanium tetrachloride as the raw material, performing the hydrolysis in a reactor equipped with a reflux condenser, and keeping the solution acidic by suppressing the escape of chlorine generated there (JP-A-11-43327) is preferred.

The concentration of the titanium salt in the acidic solution is preferably from 0.01 to 5 mol/L. If the concentration exceeds 5 mol/L, the reaction rate of hydrolysis increases and a titanium oxide sol with a large particle size and bad dispersibility may be obtained, whereas if it is less than 0.01 mol/L, the concentration of the titanium oxide obtained may decrease, giving rise to bad productivity.

The method for charging the titanium oxide sol is not particularly limited, but in order to obtain a barium calcium titanate with excellent dispersibility by preventing aggregation of the titanium oxide sol, the titanium oxide sol is preferably charged little by little into a reaction solution under heating and stirring resulting from charging a barium calcium salt at least in an amount of saturated solubility to a basic solution in which a basic compound is present. Examples of the method for charging the titanium oxide sol little by little include dropwise addition with use of a pump or the like, and injection into liquid.

In the present invention, a basic compound is contained in the basic solution used as a reaction solution, and by virtue of this basic compound, the pH of the basic solution is kept to 10 or more. This basic compound is not particularly limited but is preferably a substance which becomes a gas through evaporation, sublimation and/or thermal decomposition under atmospheric or reduced pressure. The basic compound is preferably, for example, ammonia, an organic amine having high solubility in water and having a small carbon number, or an organic base such as hydroxide of ammonium salt.

Among these, the hydroxide of ammonium salt is more preferred, because when dissolved in water, this exhibits high dissociation, acts as a strong base and does not volatilize at the reaction. On the other hand, the ammonia and organic amine having high solubility in water and having a small carbon number are weak as a base and sometimes difficult to use due to their low boiling point.

As for the hydroxide of ammonium salt, for example, choline and tetramethylammonium hydroxide (TMAH) are known and these are inexpensively available. In particular, tetramethylammonium hydroxide is being used for electronic industry and is preferred because not only those reduced in impurities such as metal ion are available but also this hydroxide can be removed as a gas by undergoing thermal decomposition at 135 to 140° C.

The barium calcium titanate powder of the present invention can also be produced even by using an inexpensive inorganic compound such as lithium hydroxide, sodium hydroxide and potassium hydroxide.

The base compound is not particularly limited and one of these base compounds may be used alone or two or more thereof may be mixed at an arbitrary ratio and used.

The thus-produced barium calcium titanate powder has a small particle diameter, a narrow particle size distribution, excellent dispersibility, high crystallinity and excellent electric properties. Particularly, in this powder, the impurities are less present and barium and calcium are solid-dissolved at an arbitrary ratio. This powder is shaped into a dielectric porcelain, a pyroelectric porcelain, a piezoelectric porcelain or a thin-film shaped article.

Such a porcelain or thin-film shaped article is used for capacitor materials, sensors and the like.

The barium calcium titanate powder may be used after the barium calcium titanate powder alone or mixed with additives, other materials and the like is formed into a slurry or paste by using one or more solvent comprising water, a known inorganic binder or a known organic binder.

The electric properties of barium calcium titanate powder can be evaluated by firing a disc shaped after adding various additives such as sintering aid to the powder or a thin-film product shaped after adding various additives to the slurry or paste containing the powder, under appropriate conditions and then measuring the fired body with use of an impedance analyzer or the like.

When a filler containing the barium calcium titanate powder is dispersed in at least one member selected from a thermosetting resin and a thermoplastic resin, a film with high dielectric constant can be obtained.

In the case of incorporating a filler other than barium calcium titanate powder, one or more member selected from the group consisting of alumina, titania, zirconia and tantalum oxide may be selected and used.

The thermosetting resin and thermoplastic resin are not particularly limited and a generally employed resin may be used, but suitable examples of the thermosetting resin include epoxy resin, polyimide resin, polyamide resin and bistriazine resin, and suitable examples of the thermoplastic resin include polyolefin resin, styrene-based resin and polyamide.

In order to uniformly disperse the barium calcium titanate powder-containing filler in at least one member selected from a thermosetting resin and a thermoplastic resin, the filler is preferably dispersed in advance in a solvent or in a mixture of the above-described resin composition and a solvent to obtain a slurry.

The method for obtaining a slurry by dispersing the filler in a solvent or in a mixture of the resin composition and a solvent is not particularly limited but preferably contains a wet grinding step.

The solvent is not particularly limited and any solvent may be used as long as it is a generally employed solvent, but, for example, methyl ethyl ketone, toluene, ethyl acetate, methanol, ethanol, N,N-dimethylformamide, N,N-dimethylacetamide, N-methylpyrrolidone and methyl cellosolve may be used individually or in combination of two or more thereof.

In order to obtain a slurry by dispersing the filler in a solvent or in a mixture of the resin composition and a solvent, the filler is preferably treated with a coupling agent. The coupling agent is not particularly limited and examples thereof include a silane coupling agent, a titanate-based coupling agent and an aluminate-based coupling agent. The hydroxyl group of the coupling agent reacts with an active hydrogen on the surface of the filler containing the barium calcium titanate powder of the present invention to cover the surface and therefore, dispersibility in a solvent becomes good. The hydrophobic group of the coupling agent may elevate the compatibility with the resin depending on the hydrophobic group selected. For example, in the case of using an epoxy resin as the resin, the coupling agent is suitably a silane coupling agent in which any one of monoamino, diamino, cationic styryl, epoxy, mercapto, anilino, ureido and the like is present in one functional group, or a titanate-based coupling agent in which any one of phosphite, amino, diamino, epoxy, mercapto and the like is present in one functional group. In the case of using a polyimide resin as the resin, the coupling agent is preferably a silane coupling agent in which any one of monoamino, diamino, anilino and the like is present in one functional group, or a titanate-based coupling agent in which any one of monoamino, diamino and the like is present in one functional group. One of these coupling agents may be used alone, or two or more thereof may be mixed and used.

The amount blended of the coupling agent is not particularly limited and it may sufficient if a part or the entire of the barium calcium titanate powder is covered. However, if the amount blended is too large, the coupling agent may remain unreacted and give an adverse effect, whereas if the amount blended is too small, the coupling effect may decrease. Therefore, the amount blended is preferably selected to allow for uniform dispersion of the filler according to the particle diameter and specific surface area of the barium calcium titanate powder-containing filler and the kind of the coupling agent. The amount of the coupling agent blended is preferably on the order of 0.05 to 20 mass % based on the barium calcium titanate powder-containing filler.

In order to complete the reaction between the hydrophilic group of the coupling agent and the active hydrogen on the surface of the barium calcium titanate powder-containing filler, a step of heat-treating the slurry formed is preferably provided. The heating temperature and time are not particularly limited, but the heat-treatment is preferably performed at 100 to 150° C. for 1 to 3 hours. When the boiling point of the solvent is 100° C. or less, the heating temperature is set to the boiling point of the solvent or less and the heating time may be prolonged according to the heating temperature set.

FIG. 1 is a cross-sectional schematic view of a multilayer ceramic capacitor as one example of the capacitor. As shown in FIG. 1, the multilayer ceramic capacitor 1 comprises a stacked body 5 in which a dielectric layer 2 and internal electrodes 3 and 4 are sequentially stacked, and external electrodes 6 and 7 fixed on the side surfaces of the stacked body 5. The internal electrodes 3 and 4 each is exposed at one end to the side surface of the stacked body 5 and each one end is connected to the external electrode 6 or 7.

The dielectric layer 2 is formed by solidifying and shaping the barium calcium titanate powder with use of a binder or the like, and the internal electrodes 3 and 4 each comprises, for example, Ni, Pd or Ag. The external electrodes 6 and 7 each comprises, for example, a sintered body of Ag, Cu or Ni, which is subjected to Ni plating.

Figure 2:
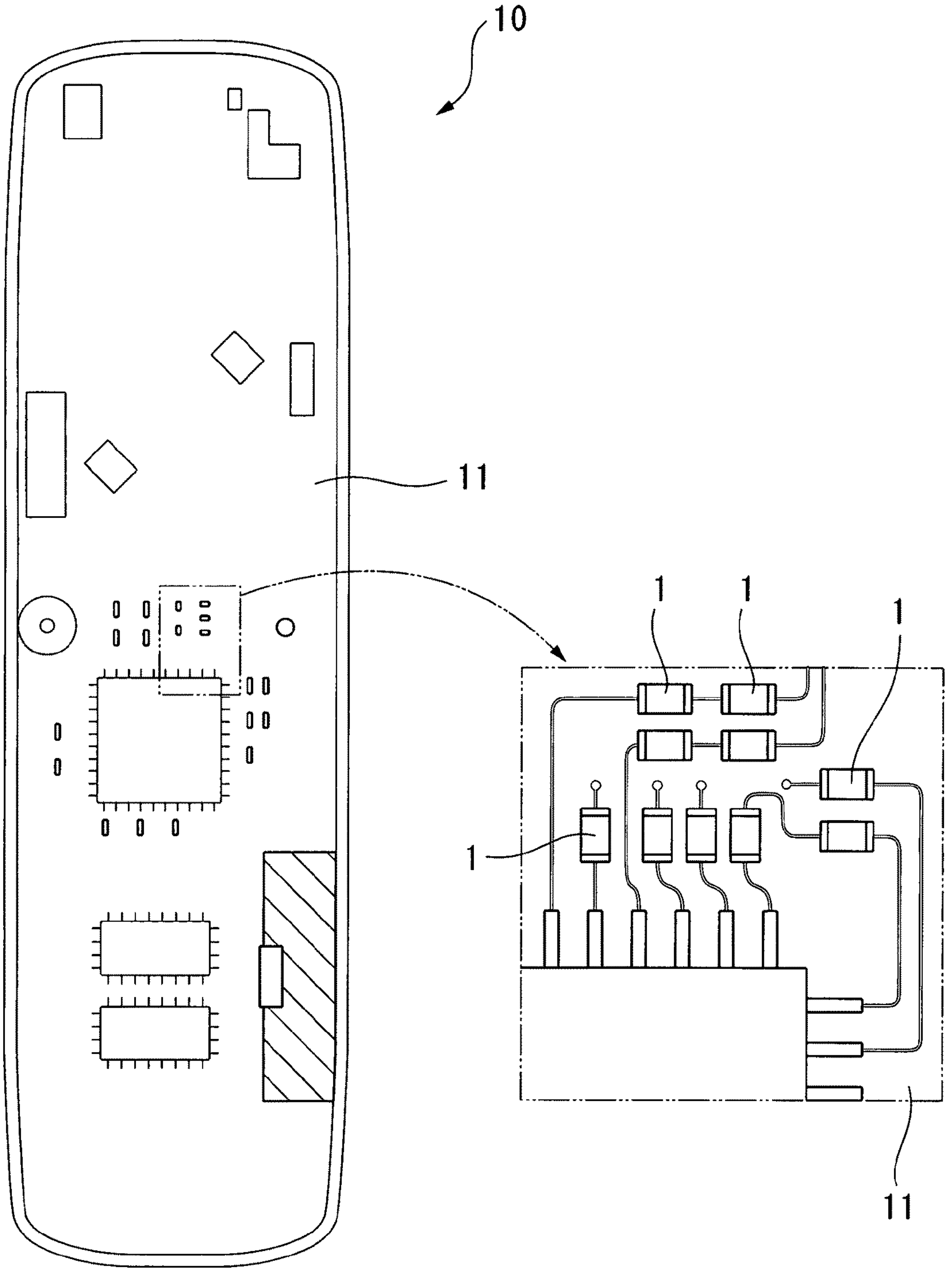
FIG. 2 is one example of an exploded view showing one example of the internal structure of a cellular phone equipped with the multilayer ceramic capacitor of FIG. 1.

The capacitor 1 shown in FIG. 1 is used, for example, by packaging it, as shown in FIG. 2, on a circuit board 11 of a cellular phone 10.

One example of the production method of the multilayer ceramic capacitor is described below.

A barium calcium titanate powder, a binder, a dispersant and water are mixed to produce a slurry. The slurry is preferably vacuum-deaerated in advance.

This slurry is thinly coated on a substrate by a doctor blade method or the like and then heated to evaporate water, whereby a dielectric layer mainly comprising a barium calcium titanate powder is formed.

On this dielectric layer, a metal paste such as Ni, Pd and Ag is coated, another dielectric layer is stacked thereon, and a metal paste working out to the internal electrode is further coated. This step is repeatedly performed, whereby a stacked body in which a dielectric layer and an internal electrode are sequentially stacked is obtained. The stacked body is preferably pressed to tightly contact the dielectric layer and the internal electrode.

Subsequently, the stacked body is cut into a capacitor size and fired at 1,000 to 1,350° C. After the firing, an external electrode paste is coated on the side surface of the stacked body and fired at 600 to 850° C. Finally, the surface of the external electrode is subjected to Ni plating.

In this way, a multilayer ceramic capacitor 1 shown in FIG. 1 is obtained.

In the multilayer ceramic capacitor 1 obtained above, a barium calcium titanate with high dielectric constant as a preferred embodiment of the present invention is used for the dielectric material, so that the electrostatic capacitance of the capacitor can be increased. Furthermore, in the capacitor 1, a barium calcium titanate having a small particle diameter as a preferred embodiment of the present invention is used for the electric material, so that the thickness of the dielectric layer can be made small and in turn, the capacitor itself can be miniaturized. Also, by virtue of the decreased thickness of the dielectric layer, the electrostatic capacitance of the capacitor can be more increased.

This down-sized multilayer ceramic capacitor can be suitably used as a part of electronic devices, particularly portable devices including cellular phone.

The present invention is described in greater detail below by referring to Examples and Comparative Examples, but the present invention is not limited to these Examples.

(Method for Measuring Dielectric Constant: Measurement 1 to 4)

The dielectric constant of the obtained barium calcium titanate was measured as follows.

Barium calcium titanate, MgO (high purity magnesium oxide 500-04R manufactured by Kyowa Chemical Industry Co., Ltd.), $Y_2O_3$ (fine granulated powders of yttrium oxide UU-HP manufactured by Shin-Etsu Chemical Co., Ltd.), $SiO_2$—BaO—Li2O3 (a glass additive for LTCC (Low Temperature Co-firing Ceramics) manufactured by Asahi Technoglass Corporation) were mixed at a ratio of 100:2:1.5:2 by molar ratio. The mixed powder of 0.3 g was uniaxially compacted by a metal mold with a diameter of 13 mm. The compact was then fired while being held at temperatures shown in Table 1 in a nitrogen atmosphere for 2 hours.

(Measurement 1)

The sintered body was obtained at the firing temperature of 1080° C.

(Measurement 2)

The sintered body was obtained at the firing temperature of 1120° C.

(Measurement 3)

The sintered body was obtained at the firing temperature of 1060° C.

(Measurement 4)

The sintered body was obtained at the firing temperature of 1040° C.

The size of the thus obtained sintered body was precisely measured, and a silver paste was coated on the sintered body. Then, electrodes were formed by baking the sintered body at 800° C. for 10 minutes in an air atmosphere to obtain a single plate capacitor.

The area, thickness and weight of the capacitor were measured and the sintered density thereof was calculated.

The capacitance of the capacitor was measured by HEWLETT PACKARD 4192A LF impedance analyzer at the frequency of 1 kHz and the temperatures of −55° C. to 125° C., and the dielectric constant was calculated from the capacitance and the size of the sintered body.

EXAMPLE 1

An aqueous solution containing titanium tetrachloride (produced by Sumitomo Titanium Corp., purity: 99.9%) at a concentration of 0.25 mol/L was prepared. This aqueous solution was charged into a reactor with a reflux condenser and heated to a temperature near the boiling point while preventing escape of chloride ion and keeping the solution acidic. The solution was kept at that temperature for 60 minutes, thereby hydrolyzing titanium tetrachloride to obtain a titanium oxide sol. The obtained titanium oxide sol was dried at 110° C. and the crystal type was examined by an X-ray diffraction apparatus (RAD-B, Rotor Flex, manufactured by Rigaku Corporation), as a result, this titanium oxide was found to be a brookite titanium oxide.

Thereafter, 450 g of an aqueous 20 mass % tetramethylammonium hydroxide solution (produced by Sachem Showa, carbonate group concentration: 60 ppm or less) and 119.89 g of barium hydroxide octahydrate were charged into a reactor with a reflux condenser and after adjusting the pH to 14, the aqueous solution was boiled with stirring. The titanium oxide sol obtained above was treated in an electrodialyzer to decrease the chloride ion to 500 ppm and after precipitation and concentration, 213.1 g of the resulting sol having a titanium oxide concentration of 15 mass % was added dropwise to the reactor at a rate of 7 g/min. While stirring as-is, boiling was maintained for 4 hours. A part of the reaction solution was filtered, and barium in the filtrate was measured by ICP spectrometry, as a result, the barium ion was 2 ppm, revealing that the reaction proceeded until the barium ion decreased to 1/1,000 of the amount charged.

Subsequently, 1.48 g of calcium hydroxide (produced by Wako Pure Chemical Industries, Ltd., guaranteed reagent) was charged into the reaction solution and while stirring as-is, boiling was maintained for 6 hours. Calcium ion was extracted from a part of the reaction solution and measured by ICP spectrometry, as a result, the calcium ion was 3 ppm, revealing that the reaction proceeded until the calcium ion decreased to 1/1,000 of the amount charged.

Thereafter, the reaction solution was filtered, and the obtained filter cake was dried at 300° C. for 5 hours to obtain a dry powder. The ratio of the actual yield to the theoretical yield calculated from the amounts of the titanium oxide, barium hydroxide and calcium hydroxide used for the reaction was 99.9%.

The dried powder was ground in a mortar and the specific surface area of the powder was measured by the BET method and found t be 48 $m^2/g$.

Figure 3:
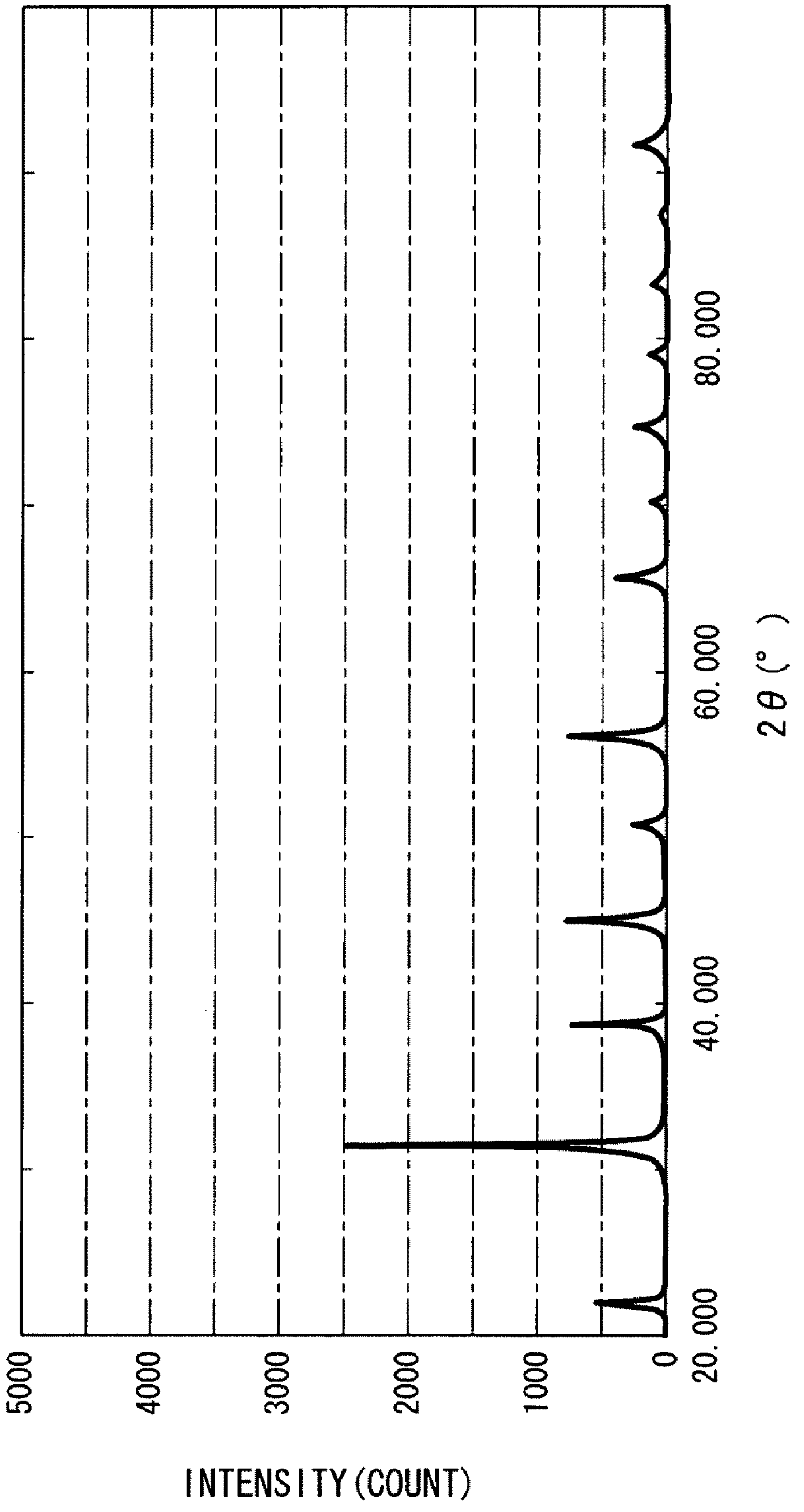
FIG. 3 is one example of an X-ray diffraction spectrum diagram of the $Ba_{0.950}Ca_{0.050}TiO_3$ powder of Example 1.

This powder was evaluated by the above-described X-ray diffraction apparatus. FIG. 3 shows the X-ray diffraction spectrum at this evaluation. As shown in FIG. 3, a diffraction peak of the orthorhombic perovskite compound was not observed and the content of orthorhombic perovskite compound was 3 mol % or less.

Also, the Rietveld analysis was performed from the X-ray diffraction intensity, as a result, the obtained powder was found to be a $Ba_{0.950}Ca_{0.050}TiO_3$ powder having solid-dissolved therein barium and calcium.

The y determined from the a-axis length and the c-axis length was 1.0045, and formula (1) was satisfied.

Figure 4:
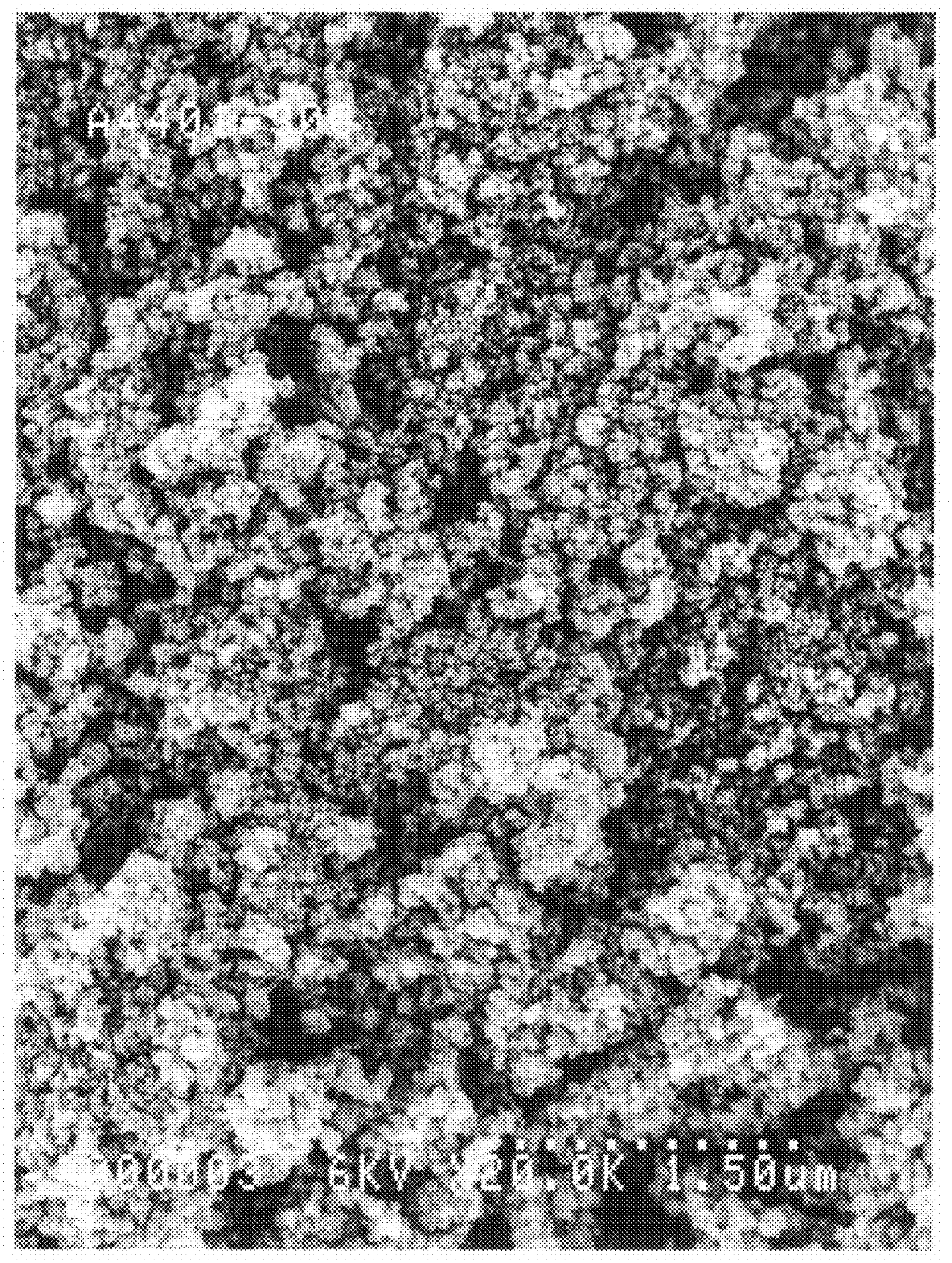
FIG. 4 is one example of a scanning electron microphotograph of the $Ba_{0.950}Ca_{0.050}TiO_3$ powder of Example 1.

The powder shape was enlargedly observed by a scanning electron microscope. FIG. 4 shows the results.

Figure 5:
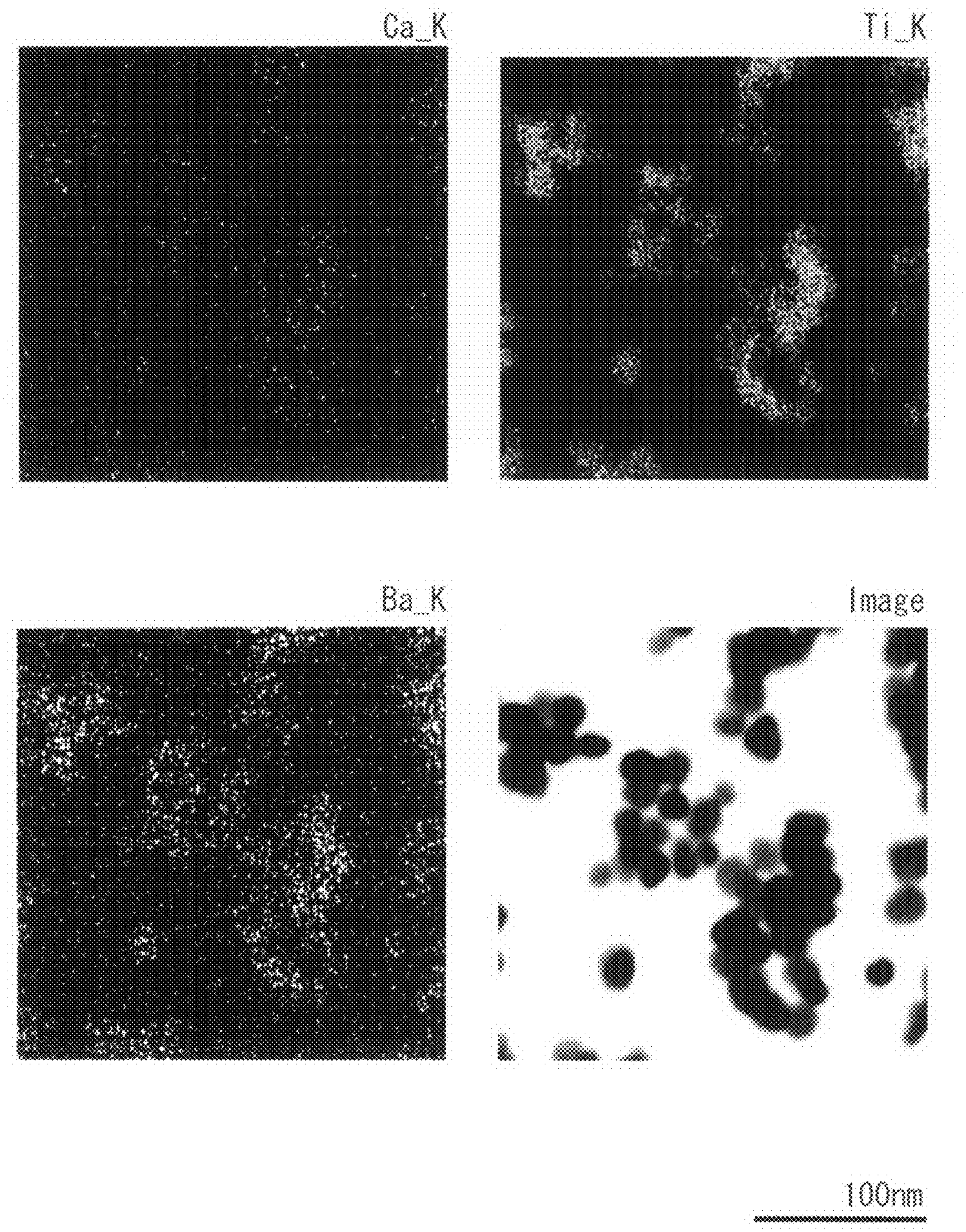
FIG. 5 is one example of a transmission electron microphotograph of the $Ba_{0.950}Ca_{0.050}TiO_3$ powder of Example 1 and an elementary analysis diagram by EDX.

Furthermore, the obtained sample was observed through a transmission electron microscope (H-9000UHR, manufactured by Hitachi, Ltd.). It was seen from the elementary analysis by EDX that, as shown in FIG. 5, barium and calcium were uniformly solid-dissolved in the powder.

The amount of the carbonate group contained in the powder was determined by using an infrared spectrometer (FTS6000, manufactured by BIORAD). Assuming that all carbonate groups are barium carbonate or calcium carbonate, a carbonate group in an amount corresponding to about 1 mass % was detected. Incidentally, a sharp absorption peak in the vicinity of 3,500 $cm^{-1}$ assignable to the hydroxyl group in the crystal lattice did not appear.

EXAMPLE 2

The powder obtained in Example 1 was charged into an electric furnace (KDFP-90, manufactured by Denken Co., Ltd.) to fire the same. The firing treatment was performed under the conditions that the temperature was elevated at a rate of 20° C./min and the powder was kept at 950° C. for 2 hours and thereafter, naturally cooled. In this way, the barium calcium titanate powder of Example 2 was obtained.

The specific surface area of the barium calcium titanate powder of Example 2 was measured by the BET method and found to be 6.8 $m^2/g$.

Figure 6:
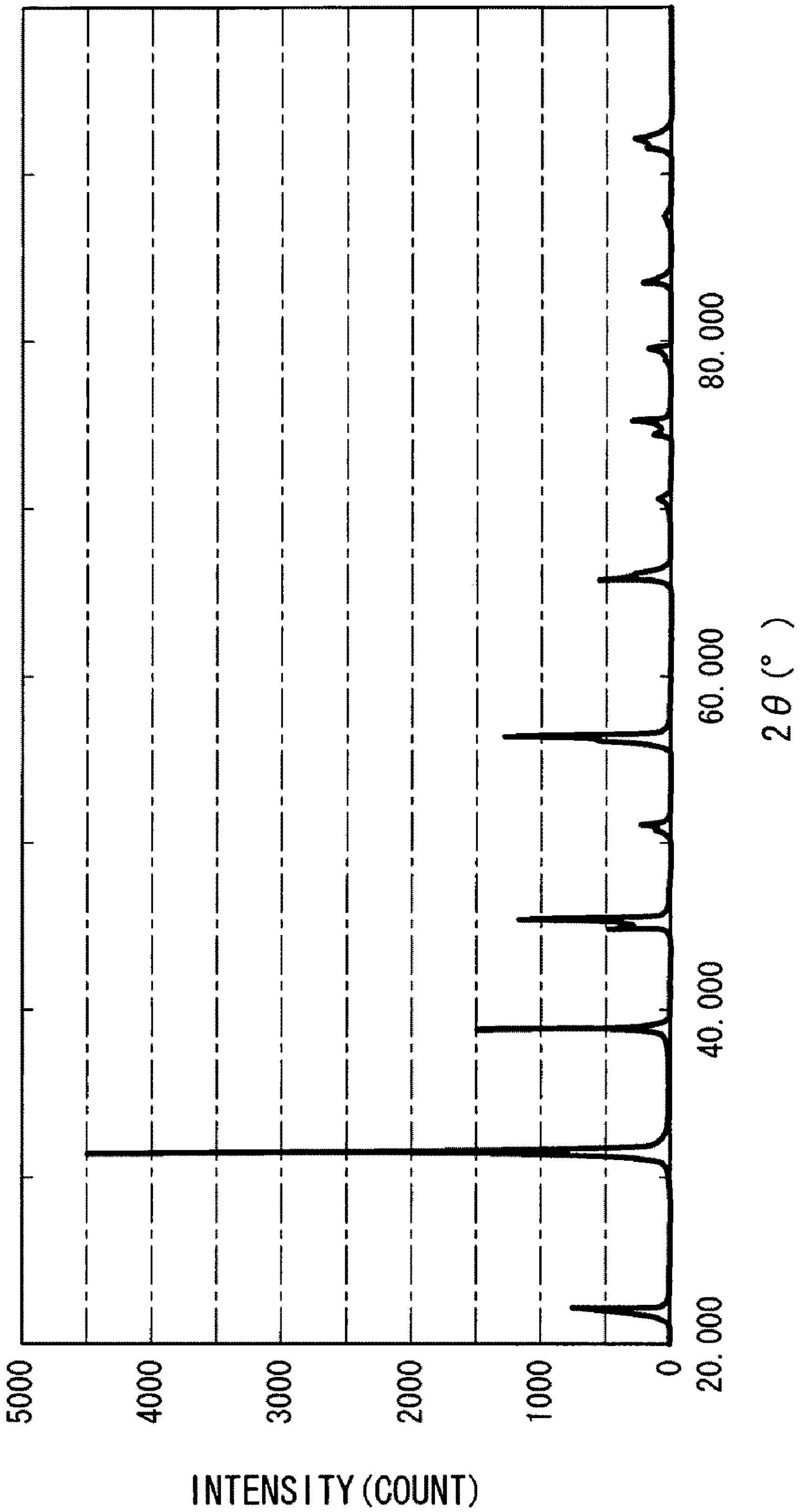
FIG. 6 is one example of an X-ray diffraction spectrum diagram of the $Ba_{0.950}Ca_{0.050}TiO_3$ powder of Example 2.

FIG. 6 shows the X-ray diffraction spectrum of the barium calcium titanate powder after the heat treatment. As shown in FIG. 6, a peak of the orthorhombic perovskite compound was not observed and the content of the orthorhombic perovskite compound was 3 mol % or less. The y (c/a) was 1.0081, and formula (1) was satisfied.

Thereafter, the barium calcium titanate powder of Example 2 was measured on the phase transition point from the orthorhombic system to the tetragonal system by using a differential scanning calorimeter (manufactured by Seiko Instruments Inc.). The conditions were assumed such that the temperature was elevated at a rate of 10° C./min from −40° C. to 200° C., the powder was kept at 200° C. for 10 minutes, and the temperature was lowered at a rate of 10° C./min until −40° C. As a result, the phase transition point from the orthorhombic system to the tetragonal system was −16° C. The barium calcium titanate powder of Example 2 was also measured on the phase transition point from the orthorhombic system to the tetragonal system by using a differential scanning calorimeter (manufactured by Bruker AXS K.K., DSC320SA). The conditions were assumed such that the temperature was elevated at a rate of 10° C./min from a room temperature to 100° C., the powder was kept at 100° C. for 10 minutes, and the temperature was lowered at a rate of 10° C./min until −100° C., and the temperature was elevated at a rate of 10° C./min until 150° C. As a result, the phase transition point from the orthorhombic system to the tetragonal system was −16° C.

Figure 7:
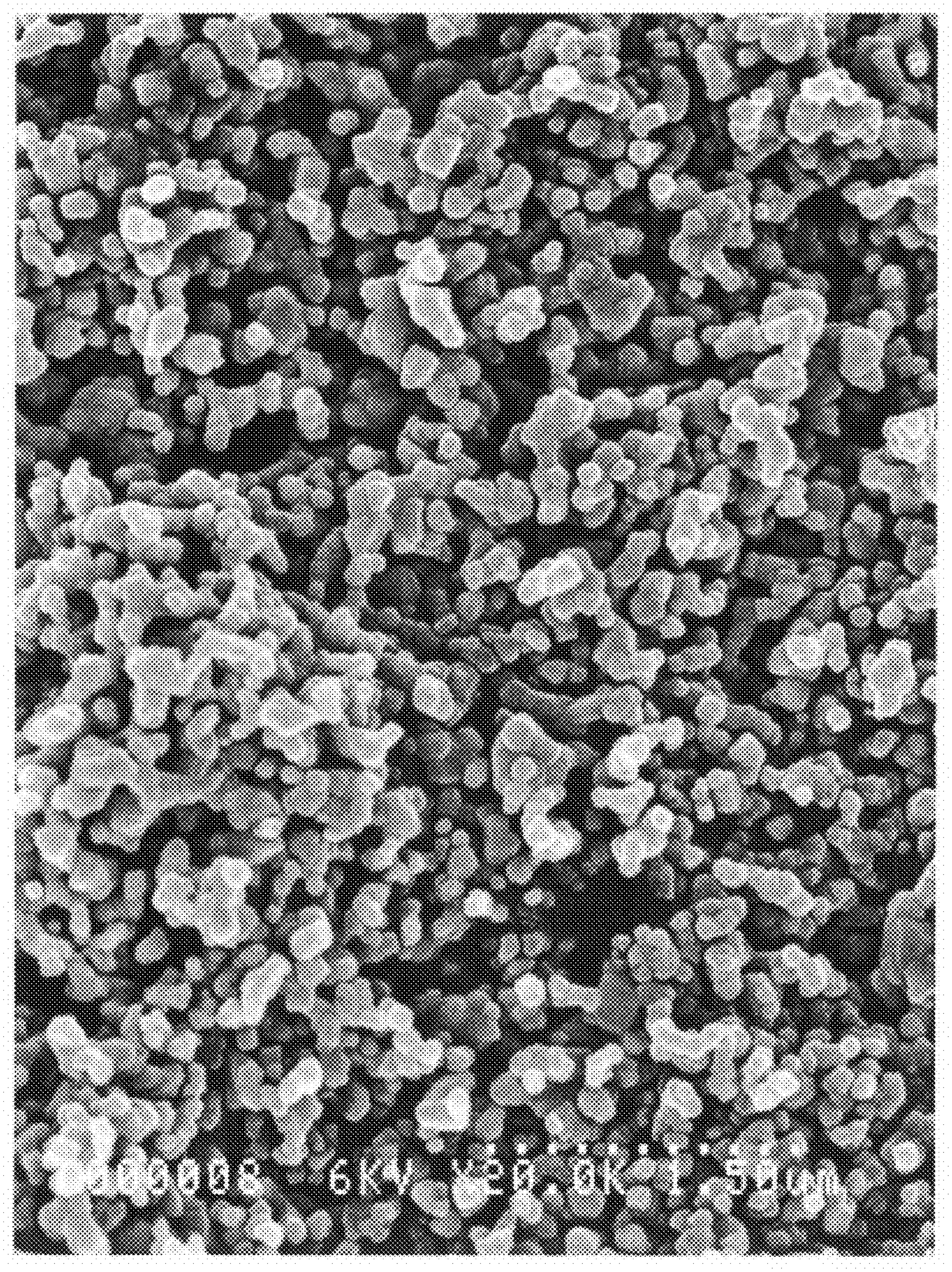
FIG. 7 is one example of a scanning electron microphotograph of the $Ba_{0.950}Ca_{0.050}TiO_3$ powder of Example 2.

The barium calcium titanate powder of Example 2 was enlargedly observed by a scanning electron microscope. FIG. 7 shows the SEM photograph.

The photograph shown in FIG. 7 was analyzed to measure the area of the barium calcium titanate powder, and a sphere-reduced volume was determined. Similarly, the area by number of the barium calcium titanate powder was determined, and the particle size distribution was obtained. Assuming that the average particle diameter on the volume basis as determined by the image analysis method is D1, the particle diameter when the volume accumulated from the smaller particle diameter side reaches 5% is D2, the particle diameter when the accumulated volume reaches 95% is D3 and the maximum particle diameter is D4, D2/D1 was 0.6, D3/D1 was 1.6, and D4/D1 was 1.8.

Figure 8:
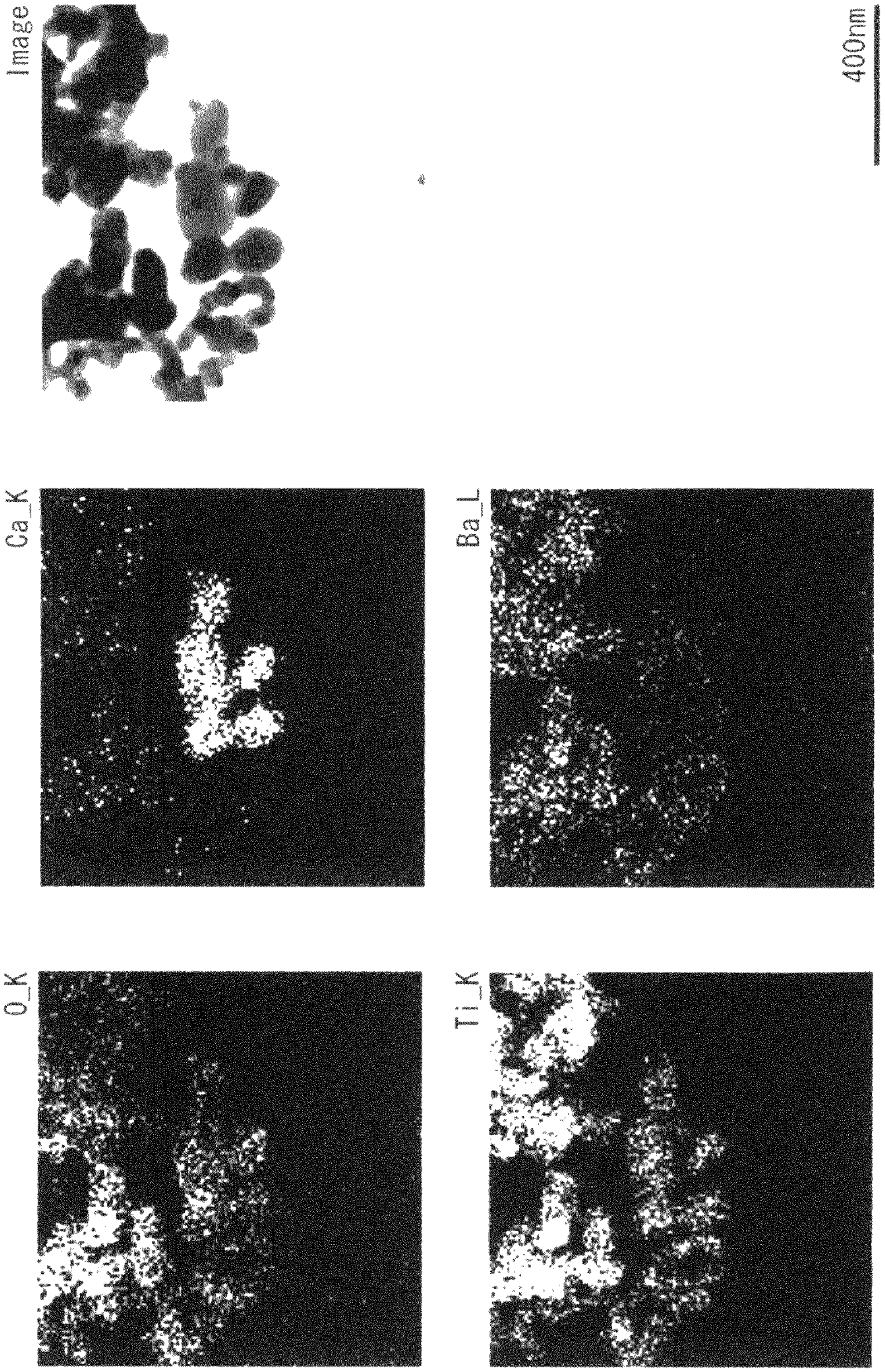
FIG. 8 is one example of a transmission electron microphotograph of the $Ba_{0.950}Ca_{0.050}TiO_3$ powder of Example 2 and an elementary analysis diagram by EDX.

Furthermore, the barium calcium titanate powder of Example 2 was observed through a transmission electron microscope. It was seen from the elementary analysis by EDX that, as shown in FIG. 8, barium and calcium were uniformly solid-dissolved in the powder.

Figure 9:
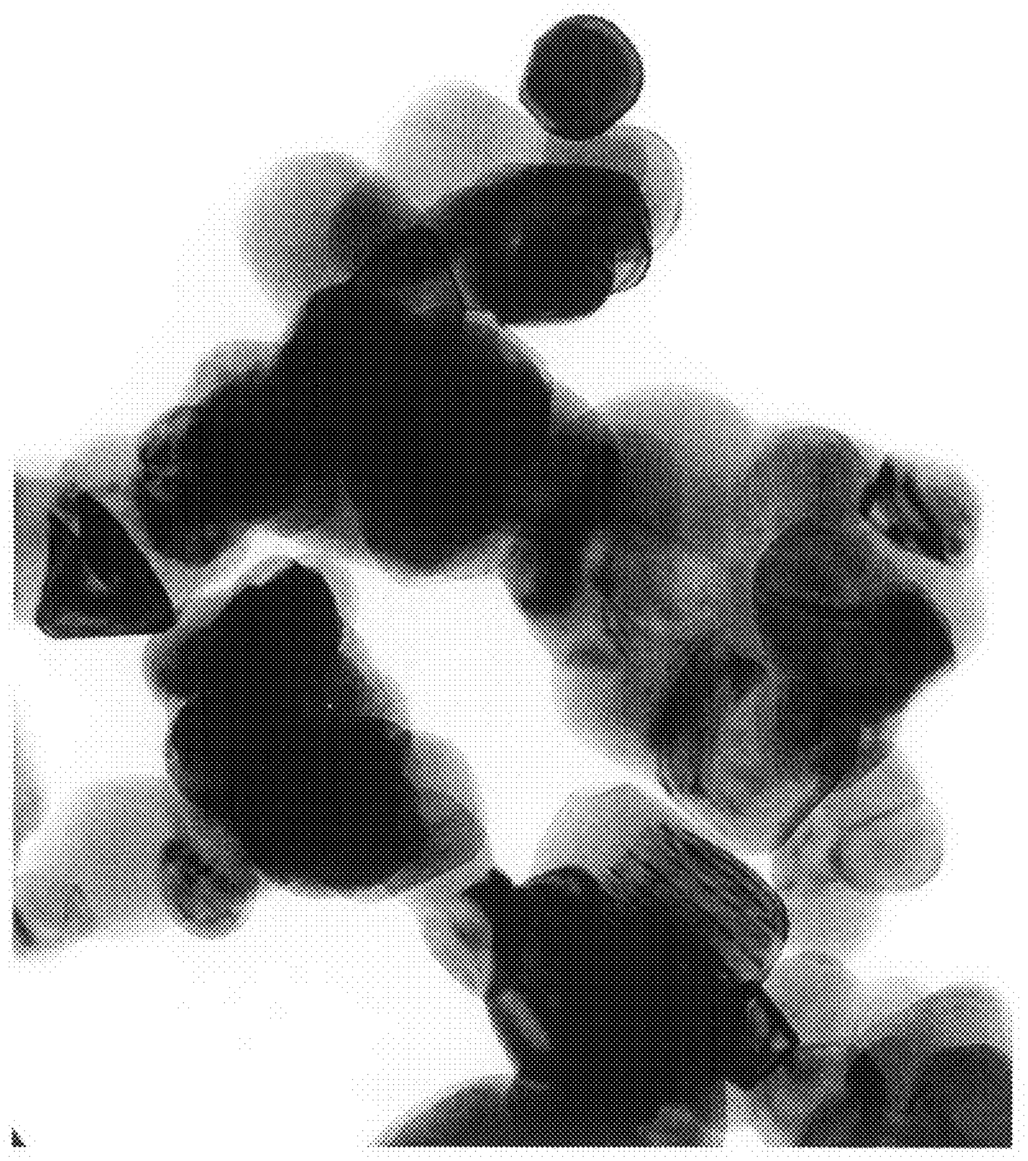
FIG. 9 is one example of a transmission electron microphotograph when the $Ba_{0.950}Ca_{0.050}TiO_3$ powder of Example 2 was observed at a magnification of 250,000.

As shown in FIG. 9, the barium calcium titanate powder of Example 2 was observed by a transmission electron microscope at a magnification of 250,000, but defects ascribable to the elimination of hydroxyl group were not observed.

Also, from the electron beam diffraction image, the barium calcium titanate powder of Example 2 was found to be a single crystal.

Table 1 shows the measurement result of the dielectric constant. (Measurement 1)

EXAMPLE 3

The barium titanate calcium of Example 3 was obtained by firing the powder obtained in Example 1 in the same way as in Example 2 except that the powder was held at 1000° C. for 2 hours.

The specific surface area of the barium calcium titanate powder of Example 3 was 5.1 $m^2$/g. The y was 1.0093, and formula (1) was satisfied. Furthermore, D2/D1 determined by the image analysis method was 0.6, D3/D1 was 1.7 and D4/D1 was 1.8.

Table 1 shows the measurement result of the dielectric constant. (Measurement 1 and 2)

EXAMPLE 4

The barium calcium titanate powder of Example 4 was produced by the same operation as in Example 1 except that the amount of the barium hydroxide octahydrate charged was 107.27 g and the amount of the calcium hydroxide charged was 4.45 g.

The specific surface area of the obtained barium calcium titanate powder Example 4 was 49 $m^2$/g. A peak of the orthorhombic perovskite compound was not observed in the X-ray diffraction spectrum and the content of orthorhombic perovskite compound was 3 mol % or less.

Also, the Rietveld analysis was performed from the X-ray diffraction intensity, as a result, the obtained powder was found to be a $Ba_{0.850}Ca_{0.150}TiO_3$ powder having solid-dissolved therein barium and calcium. The y was 1.0048, and formula (2) was satisfied.

Furthermore, the powder of Example 4 was observed by a transmission electron microscope at a magnification of 250,000, but defects ascribable to the elimination of hydroxyl group were not observed.

EXAMPLE 5

The barium titanate calcium of Example 5 was obtained by firing the powder obtained in Example 4 in the same way as in Example 2 except that the powder was held at 1100° C. for 2 hours.

The specific surface area of the obtained powder of Example 5 was 5 $m^2$/g. A peak of the orthorhombic perovskite compound was not observed in the X-ray diffraction spectrum and the content of orthorhombic perovskite compound was 3 mol % or less. The y was 1.0092, and formula (1) was satisfied. Also, D2/D1 determined by the image analysis method was 0.6, D3/D1 was 1.8 and D4/D1 was 1.9. Furthermore, the powder was observed by a transmission electron microscope at a magnification of 250,000, but defects ascribable to the elimination of hydroxyl group were not observed.

Table 1 shows the measurement result of the dielectric constant. (Measurement 1)

EXAMPLE 6

The barium titanate calcium powder of Example 6 was manufactured by performing a similar operation to that of Example 1 except that an autoclave was used as a reactor vessel and the reaction temperature was set to 110° C.

The specific surface area of the obtained barium calcium titanate powder of Example 6 was 43 $m^2$/g. A peak of the orthorhombic perovskite compound was not observed in the X-ray diffraction spectrum and the content of orthorhombic perovskite compound was 3 mol % or less.

Furthermore, the Rietveld analysis was performed from the X-ray diffraction intensity, as a result, the obtained powder was found to be a $Ba_{0.950}Ca_{0.050}TiO_3$ powder having solid-dissolved therein barium and calcium. The y was 1.0038, and formula (2) was satisfied.

Furthermore, the powder of Example 6 was observed by a transmission electron microscope at a magnification of 250,000, but defects ascribable to the elimination of hydroxyl group were not observed.

EXAMPLE 7

Barium titanate calcium of Example 7 was obtained by firing the powder obtained in Example 6 in the same way as in Example 2 except that the powder was held at 880° C. for 2 hours.

The specific surface area of the obtained powder of Example 7 was 10 $m^2$/g. A peak of the orthorhombic perovskite compound was not observed in the X-ray diffraction spectrum and the content of orthorhombic perovskite compound was 3 mol % or less. The y was 1.0067, and formula (2) was satisfied. Also, D2/D1 determined by the image analysis method was 0.8, D3/D1 was 1.5 and D4/D1 was 1.6. Furthermore, the powder was observed by a transmission electron microscope at a magnification of 250,000, but defects ascribable to the elimination of hydroxyl group were not observed.

Table 1 shows the measurement result of the dielectric constant. (Measurement 3)

COMPARATIVE EXAMPLE 1

An aqueous 20 mass % tetramethylammonium hydroxide solution (produced by Sachem Showa, carbonate group concentration: 60 ppm or less) (450 g), 119.89 g of barium hydroxide octahydrate and 1.48 g of calcium hydroxide were charged into a reactor with a reflux condenser and after adjusting the pH to 14, the aqueous solution was boiled with stirring. Then, a titanium oxide sol was prepared in the same manner as in Example 1 and treated in an electrodialyzer to decrease the chloride ion to 500 ppm and after precipitation and concentration, 213 g of the resulting sol having a titanium oxide concentration of 15 mass % was added dropwise to the reactor at a rate of 7 g/min. While stirring as-is, boiling was maintained for 4 hours. A part of the reaction solution was filtered, and barium in the filtrate was measured by ICP spectrometry, as a result, the barium ion was 2 ppm, revealing that the reaction proceeded until the barium ion decreased to 1/1,000 of the amount charged.

Thereafter, the same operation as in Example 1 except for the above-described operation was performed to produce the barium calcium titanate powder of Comparative Example 1.

Figure 10:
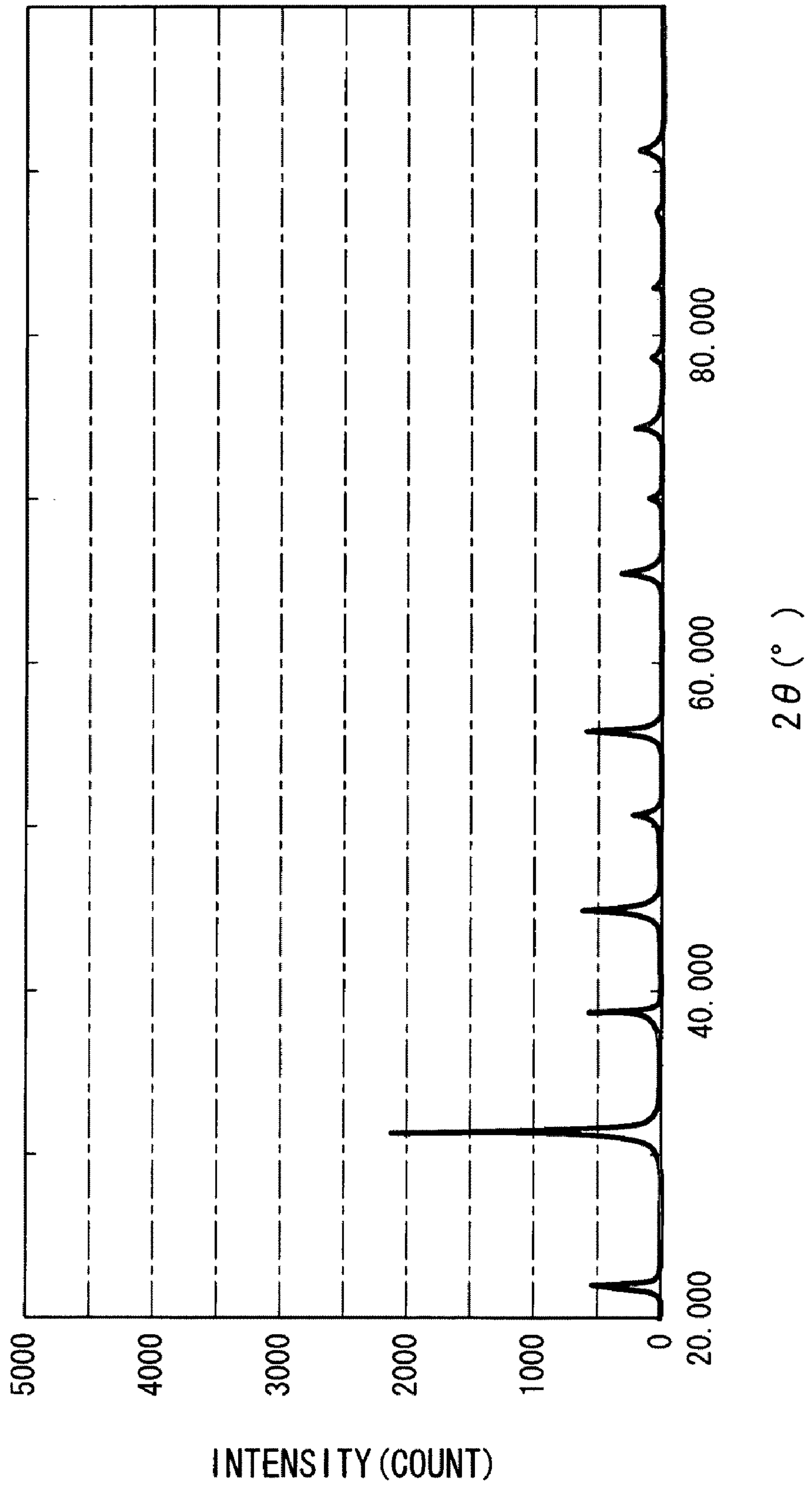
FIG. 10 is one example of an X-ray diffraction spectrum diagram of the $Ba_{0.950}Ca_{0.050}TiO_3$ powder of Comparative Example 1.
Figure 11:
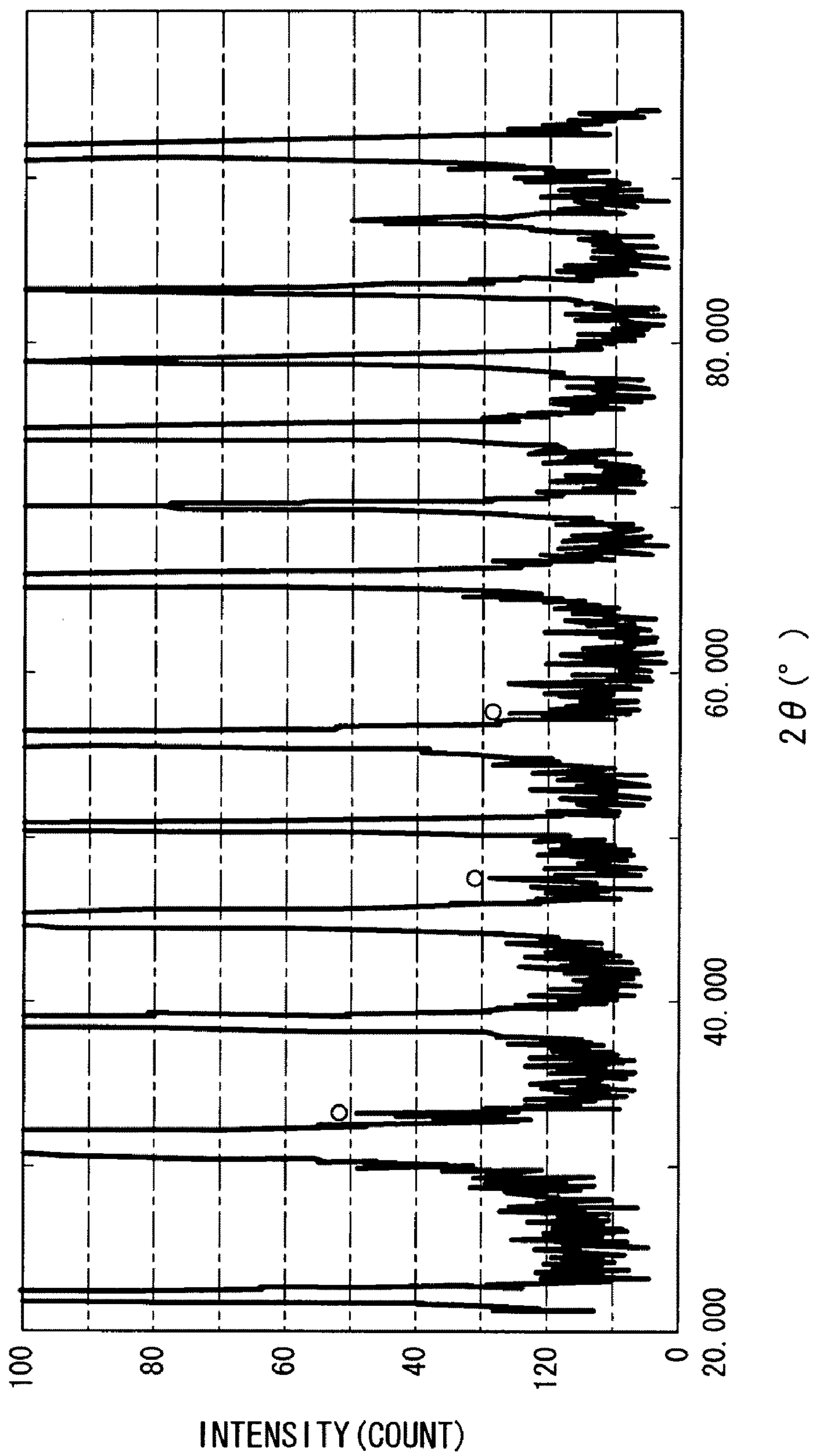
FIG. 11 is one example of an X-ray diffraction spectrum diagram obtained by enlarging FIG. 10.

The specific surface area of the obtained powder was 38 $m^2/g$. FIGS. 10 and 11 each shows the X-ray diffraction spectrum diagram of the powder. FIG. 11 is an enlarged view of FIG. 10. In FIG. 11, the peaks of the orthorhombic perovskite compound are indicated by the mark ○. In this way, in the X-ray diffraction spectrum of the barium calcium titanate of Comparative Example 1, peaks of the orthorhombic perovskite compound were observed. From this, the content of the orthorhombic perovskite compound was found to exceed 3 mol %.

COMPARATIVE EXAMPLE 2

The barium titanate calcium of Comparative Example 2 was obtained by firing the powder obtained in Comparative Example 1 in the same way as in Example 2 except that the powder was held at 1000° C. for 2 hours.

Figure 12:
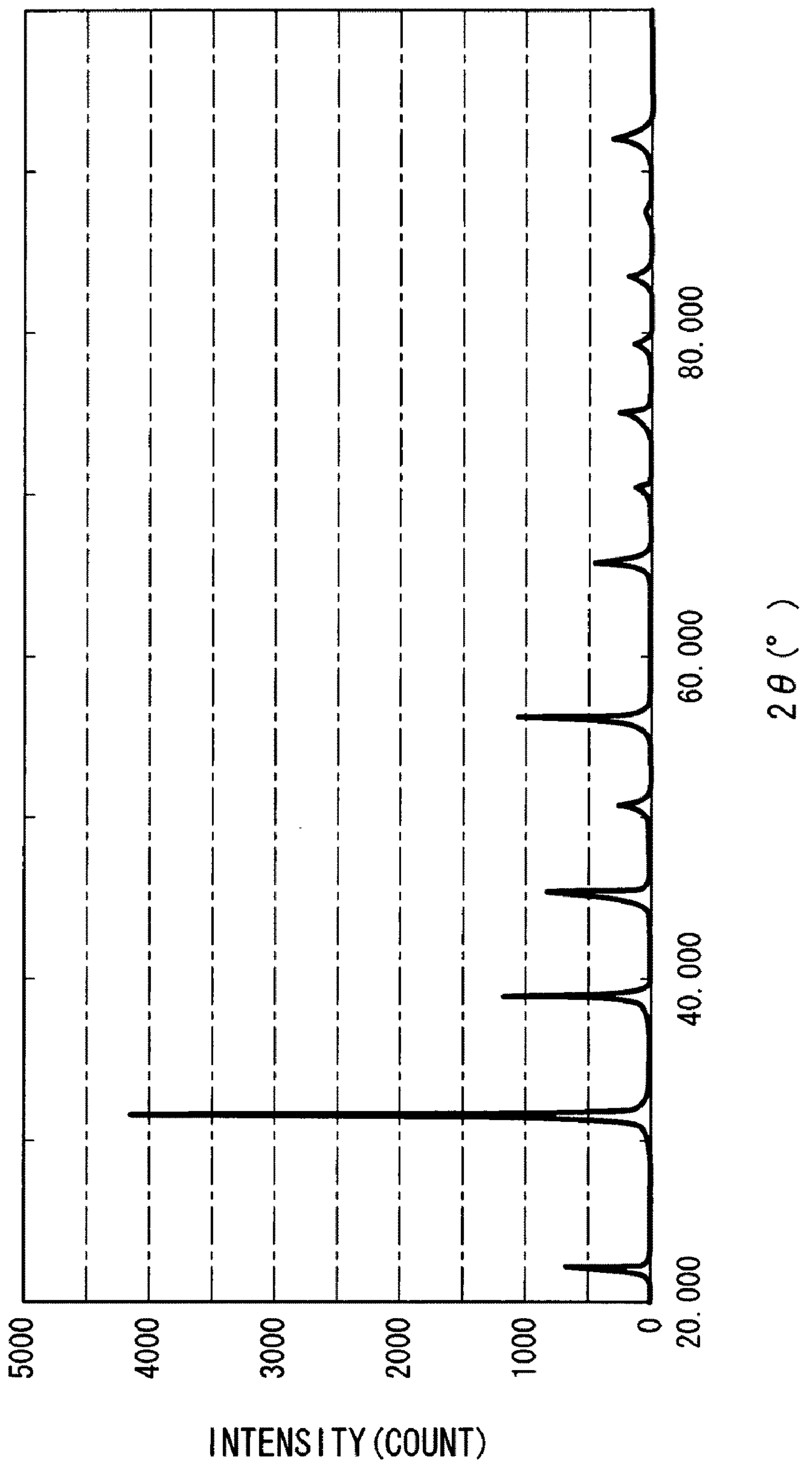
FIG. 12 is one example of an X-ray diffraction spectrum diagram of the $Ba_{0.950}Ca_{0.050}TiO_3$ powder of Comparative Example 2.
Figure 13:
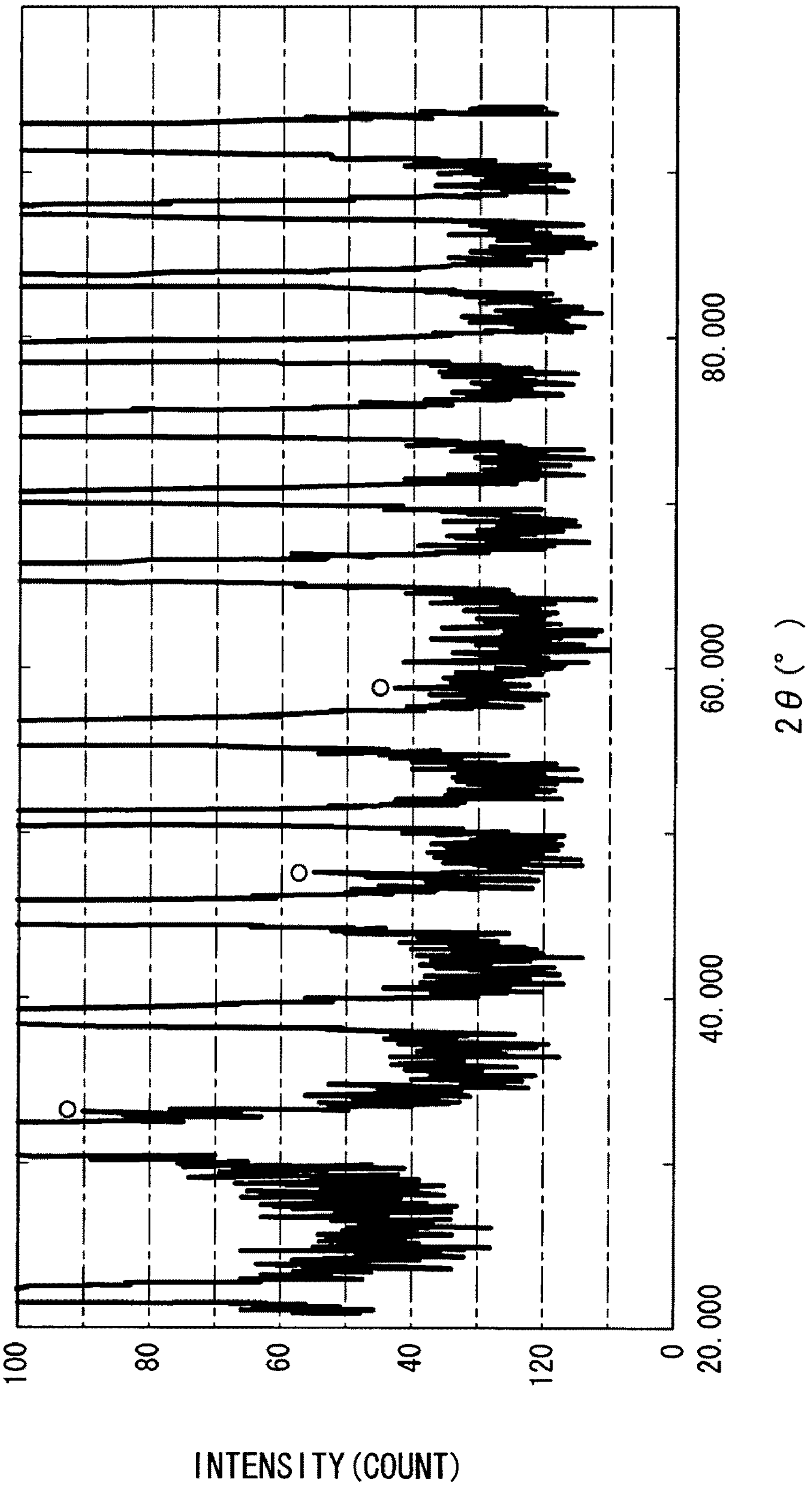
FIG. 13 is one example of an X-ray diffraction spectrum diagram obtained by enlarging FIG. 12.

The specific surface area of the obtained powder was 5.1 $m^2/g$. FIGS. 12 and 13 each shows the X-ray diffraction spectrum diagram of the powder. FIG. 13 is an enlarged view of FIG. 12. In FIG. 13, the peaks of the orthorhombic perovskite compound are indicated by the mark ○. In this way, also in the X-ray diffraction spectrum of the barium calcium titanate of Comparative Example 2, peaks of the orthorhombic perovskite compound were observed. From this, the content of the orthorhombic perovskite compound was found to exceed 3 mol %. The y was 1.0077, and formula (1) was not satisfied. Furthermore, the phase transition point from the orthorhombic system to the tetragonal system was measured and found to be −15° C. D2/D1 determined by the image analysis method was 0.4, D3/D1 was 2.0 and D4/D1 was 2.5.

Table 1 shows the measurement result of the dielectric constant. (Measurement 1 and 4)

COMPARATIVE EXAMPLE 3

The barium calcium titanate powder of Comparative Example 3 was produced by the same operation as in Comparative Example 1 except that the amount of the barium hydroxide octahydrate charged was 107.27 g and the amount of the calcium hydroxide charged was 4.45 g.

The specific surface area of the obtained powder was 38 $m^2/g$. In the X-ray diffraction spectrum of this powder, a peak of the orthorhombic perovskite compound was observed. From this, the content of the orthorhombic perovskite compound was found to exceed 3 mol %.

COMPARATIVE EXAMPLE 4

The barium calcium titanate powder of Comparative Example 4 was produced by performing the firing in the same manner as in Example 2 except that the powder obtained in Comparative Example 3 was kept at 1,020° C. for 2 hours.

The specific surface area of the obtained powder was 5.3 $m^2/g$. Also, a peak of the orthorhombic perovskite compound was observed in the X-ray diffraction spectrum of this powder, and the content of the orthorhombic perovskite compound was found to exceed 3 mol %. They was 1.0081, and formula (1) was not satisfied. Furthermore, D2/D1 determined by the image analysis method was 0.3, D3/D1 was 2.2 and D4/D1 was 2.8.

Table 1 shows the measurement result of the dielectric constant. (Measurement 1 and 4)

TABLE 1

| | Firing Temperature (° C.) | Sintered Density (%) | Dielectric Constant at 25° C. | Temperature Characteristics |
|---|---|---|---|---|
| Example 2 (Measurement 1) | 1080 | 95 | 1300 | good |
| Example 3 (Measurement 1) | 1080 | 95 | 1400 | good |
| Example 3* (Measurement 2) | 1120 | 95 | 1800 | good |
| Example 5 (Measurement 1) | 1080 | 95 | 1200 | good |
| Example 7 (Measurement 3) | 1060 | 95 | 1200 | good |
| Comparative Example 2 (Measurement 1) | 1080 | 92 | 1400 | poor |
| Comparative Example 2 (Measurement 4) | 1040 | 92 | 1100 | good |
| Comparative Example 4 (Measurement 1) | 1080 | 90 | 1300 | poor |
| Comparative Example 4 (Measurement 4) | 1040 | 90 | 1000 | good |

The temperature characteristic satisfying the X7R of the EIA standard was described as "good," and one not satisfying the X7R was described as "poor."

Referring to *, barium calcium titanate, MgO (high purity magnesium oxide 500-04R manufactured by Kyowa Chemical Industry Co., Ltd.), $Y_2O_3$ (fine granulated powders of yttrium oxide UU-HP manufactured by Shin-Etsu Chemical Co., Ltd.), $SiO_2$—BaO—Li2O3 (a glass additive for LTCC (Low Temperature Co-firing Ceramics) manufactured by Asahi Technoglass Corporation) were mixed in a ratio of 100:0.5:1.5:2 by molar ratio at the time of manufacturing the capacitor.

Table 1 shows the evaluated results of the dielectric constant of the single plate capacitors.

The sintered densities of the barium titanate calcium according to Examples 2, 3, 5, and 7 of the present invention were higher (95%), and the temperature characteristics thereof satisfied the X7R of the EIA standard ("good").

Since the sintered densities of the barium titanate calcium of Comparative Examples 2 and 4 were lower (90~92%), the temperature characteristics did not satisfied the X7R of the EIA standard ("poor") when the firing temperature was 1080° C. On the other hand, the temperature characteristics satisfied the X7R of the EIA standard ("good") when the firing temperature was 1040° C., however, the dielectric constants were lower (1000~1100).

INDUSTRIAL APPLICABILITY

The barium calcium titanate of the present invention has a remarkable effect that a fine barium calcium titanate powder having excellent dispersibility, reduced impurities and high crystallinity and being solid-dissolved at an arbitrary ratio, and a production process thereof are provided.

This barium calcium titanate powder and a slurry or paste containing the powder can exert excellent electric properties, and a dielectric material, a piezoelectric material, a pyroelectric material or the like having excellent performance, such as porcelain, thin film and dielectric film, can be obtained therefore. Furthermore, by using such a material for an electronic device, a down-sized lightweight electronic device can be realized. The dielectric film has excellent electric property and therefore, even when formed into a thin film, the dielectric film can exert excellent properties and can be applied to an embedded capacitor or the like. Use of this capacitor in electronic devices such as cellular phone or digital camera is very effective for the realization of a down-sized, lightweight and high-performance device.

The invention claimed is:

1. A barium calcium titanate represented by the compositional formula:

$$(Ba_{(1-X)}Ca_X)_Y TiO_3, \text{ wherein } 0.1 \leqq X < 0.2 \text{ and } 0.98 \leqq Y \leqq 1.02,$$

wherein the barium calcium titanate contains an orthorhombic perovskite compound in an amount 0 to 3 mol %, and wherein a specific surface area D of the barium calcium titanate is from 1 to 100 $m^2/g$.

2. The barium calcium titanate as claimed in claim 1, wherein the ratio (c/a) between the a-axis length and the c-axis length of a crystal lattice of the barium calcium titanate as calculated by the Rietveld method is y, the relationship between the y and the specific surface area D satisfies the following formula (1) or (2):

$$y \geqq 1.0095 - 8.8 \times 10^{-6} \times D^3, \text{ when } 1 \leqq D \leqq 9.7 \quad (1),$$

or $$y \geqq 1.003, \text{ when } 9.7 < D \leqq 100 \quad (2).$$

3. The barium calcium titanate as claimed in claim 1, wherein the barium calcium titanate contains 80% or more of a single crystal particle.

4. The barium calcium titanate as claimed in claim 1, which contains 80% or more of a particle not allowing for the presence of a vacancy of 1 nm or more within the particle.

5. The barium calcium titanate as claimed in claim 1, wherein when an average particle diameter of the barium calcium titanate on the volume basis as determined by the image analysis method is D1 and a particle diameter of the barium calcium titanate when the volume accumulated from a smaller particle diameter side of the barium calcium titanate reaches 5% is D2, D2/D1 is from 0.5 to 1.

6. The barium calcium titanate as claimed in claim 1, wherein when an average particle diameter of the barium calcium titanate on the volume basis as determined by the image analysis method is D1, a particle diameter of the barium calcium titanate when the volume accumulated from a smaller particle diameter side of the barium calcium titanate reaches 95% is D3 and a maximum particle diameter of the barium calcium titanate is D4, D3/D1 is from 1 to 1.8 and D4/D1 is from 1 to 2.

7. The barium calcium titanate as claimed in claim 1, which is a powder having a specific surface area D of 5 to 100 $m^2/g$.

* * * * *